(12) United States Patent
Yamada et al.

(10) Patent No.: US 6,296,928 B1
(45) Date of Patent: Oct. 2, 2001

(54) HARD COATING COATED MEMBER HAVING EXCELLENT WEAR RESISTANCE

(75) Inventors: Yasuyuki Yamada; Taiitsu Aoki; Yusuke Tanaka; Seiichiro Kitaura; Yasutaka Okazaki; Natsuki Ichimiya; Genki Matsumoto; Koichi Maeda, all of Akashi; Toshiki Sato, Kobe; Tatsuya Yasunaga, Kobe; Kenji Yamamoto, Kobe, all of (JP)

(73) Assignee: MMC Kobelco Tool Co., Ltd., Akashi (JP)

( * ) Notice: Subject to any disclaimer, the term of this patent is extended or adjusted under 35 U.S.C. 154(b) by 0 days.

(21) Appl. No.: 09/304,055

(22) Filed: May 4, 1999

(30) Foreign Application Priority Data

| | | |
|---|---|---|
| Oct. 27, 1998 | (JP) | 10-305934 |
| Oct. 27, 1998 | (JP) | 10-305935 |
| Oct. 27, 1998 | (JP) | 10-305936 |
| Oct. 27, 1998 | (JP) | 10-305937 |
| Oct. 27, 1998 | (JP) | 10-305938 |
| Oct. 27, 1998 | (JP) | 10-305939 |

(51) Int. Cl.$^7$ ................................... C23C 14/06
(52) U.S. Cl. .................. 428/216; 428/212; 428/336; 428/697; 428/698; 428/699
(58) Field of Search .................. 428/697, 698, 428/699, 216, 212, 336

(56) References Cited

U.S. PATENT DOCUMENTS

| | | | | |
|---|---|---|---|---|
| 4,753,854 | * | 6/1988 | Gavrilov et al. ........... | 428/698 |
| 5,656,383 | | 8/1997 | Tanaka et al. . | |
| 5,707,748 | * | 1/1998 | Bergmann .................. | 428/469 |
| 5,981,049 | * | 11/1999 | Ohara et al. ............... | 428/216 |

FOREIGN PATENT DOCUMENTS

| | | |
|---|---|---|
| 0 846 784 | 6/1998 | (EP) . |
| 60-248879 | 12/1985 | (JP) . |
| 3-120354 | 5/1991 | (JP) . |
| 4-221057 | 8/1992 | (JP) . |
| 5-88309 | 12/1993 | (JP) . |
| 7-173608 | 7/1995 | (JP) . |
| 10-18024 | 1/1998 | (JP) . |
| 10-158861 | 6/1998 | (JP) . |
| 10-237628 | 9/1998 | (JP) . |

OTHER PUBLICATIONS

O. Knotek, et al., Surface and Coatings Technology, vol. 36, pp. 265–273, "On Reactively Sputtered Ti–Al–V Carbonitrides", 1988.

* cited by examiner

Primary Examiner—Archene Turner
(74) Attorney, Agent, or Firm—Oblon, Spivak, McClelland, Maier & Neustadt, P.C.

(57) ABSTRACT

The present invention provides a member coated with a hard coating and to attain excellent wear resistance. The hard coating includes: an adhesion reinforcing layer formed on a surface of the member; and a second layer formed on the adhesion reinforcing layer and having a composition represented by the following formula:

$$(Al_p Ti_q V_r)(N_u C_v)$$

where $0 \leq p \leq 0.75$, $0.20 \leq q \leq 0.75$, $0.10 \leq r \leq 0.75$, $p+q+r=1$, $0.6 \leq u \leq 1$, and $u+v=1$.

In order to further enhance the adhesion of the hard coating to the member, an intermediate layer may be formed between the first and second layers.

39 Claims, No Drawings

HARD COATING COATED MEMBER HAVING EXCELLENT WEAR RESISTANCE

BACKGROUND OF THE INVENTION

1. Field of the Invention

The present invention relates to a member coated with a hard coating to attain excellent wear resistance. More specifically, the present invention relates to a member coated with a hard coating intended for use in wear-resistant members such as cutting tools employed in milling, cutting, drilling operations etc., molds, bearings, dies, rollers for which a high level of hardness is demanded, and heat-corrosion resistant members such as screw of extruders, cylinders and the like.

1. Description of the Background

The formation of a hard coating such as TiN and TiCN on the surface of a tool in order to improve the wear resistance of the tool is a technique commonly used in the field of cutting tools for which a high level of wear resistance is demanded such as high speed steel tools, cemented carbide tools etc.

There is also a hard coating made of a carbonnitride composite of Ti and any metal in the group 4A, 5A, and 6A metals other than Ti. The hard coating of this composition is suggested, for example, in Japanese Unexamined Patent Publications Nos. 60-248879, 4-221057, and 7-173608, as a coating having superior properties than the TiN and TiCN hard coatings. Specifically, the carbonnitride composite coating has a composition of (Ti, M)(N, C) (where M is Ti, Zr, Hf, V, Nb, Ta, Cr, Mo, or W). The carbonnitride composite coating suggested in these prior arts shows excellent wear resistance; however, its adhesion is poorer than that of TiN and TiCN coatings. Due to the poor adhesion, there is a problem that the coating peels off from the base material during use.

In an attempt to give enhanced adhesion to the hard coating, Japanese Unexamined Patent Publication No. 10-158861 suggests to form an intermediate layer of TiN between the hard coating and the base material. The TiN intermediate layer, however, is not effective in increasing the adhesion of the hard coating to a sufficient level. Rather, the TiN intermediate layer causes another problem that it impairs the wear resistance. This is because the hardness of the TiN intermediate layer is low. The TiN intermediate layer with low hardness defeats the effect of the (Ti, M)(N, C) coating with high hardness. This disadvantage is especially pronounced in the case where this technique is applied to a cutting tool as a base material. In the case of cutting a material with low hardness such as S50C, a cutting tool coated with a (Ti, M)(N, C) hard coating exhibits substantially the same wear resistance as that coated with a (Al, Ti)N hard coating. The (Al, Ti)N hard coating recently receives attention for its excellent wear resistance. However, in the case of cutting a material with high hardness such as JIS (Japanese Industrial Standard) SKD 61 hardened steel, the cutting tool coated with the (Ti, M)(N, C) coating exhibits poor wear resistance as compared with that coated with the (Al, Ti)N coating.

The (Al, Ti)N coating also has a problem. As has described above, the (Al, Ti)N coating recently receives an attention as a coating for cutting tools intended for cutting steel materials of high hardness and for use in high-speed cutting operations. It is true that cutting tool coated with (Al, Ti)N coating exhibits higher wear resistance than that coated with (Ti, M)(N, C) when it is used for cutting steel materials of high hardness such as JIS SKD61 hardened steel. However, when the cutting tool coated with (Al, Ti)N coating is used for cutting steel materials of low hardness such as S50C carbon steel, there are some cases where it exhibits poor wear resistance as compared with that coated with (Ti, M)(N, C) coating depending on cutting conditions.

Besides a tertiary composite material such as (Al, Ti)N, it is also suggested to use a quaternary composite material in order to form a coating with excellent wear resistance. For example, Japanese Unexamined Patent Publications Nos. 3-120354, 10-18024, and 10-237628, and Japanese Examined Patent Publication No. 5-88309 disclose an (Al, Ti, V)N hard coating. The cutting tool coated with the (Al, Ti, V)N hard coating exhibits high wear resistance in the case of cutting steel materials with low hardness such as JIS S50C carbon steel. However, the (Al, Ti, V)N coating has a problem that it has poor adhesion to a base material, and therefore, easily peels off. In order to improve its adhesion, a TiN intermediate layer is formed between the coating and the base material, or the composition of Al and V of the coating is gradually changed along the its thickness direction. However, these techniques do not sufficiently improve the adhesion of the coating. Rather, the cutting tool coated with the (Al, Ti, V)N coating exhibits poor wear resistance as compared with those coated with the (Al, Ti)N coating in the case of cutting work materials with high hardness such as JIS SKD61 hardened steel.

SUMMARY OF THE INVENTION

The present invention has been conducted in light of the above-described problems in the prior art, and an objective thereof is to provide a member coated with a hard coating thereby attaining excellent wear resistance.

According to an aspect of the invention, a member is coated with a hard coating and has an excellent wear resistance. The hard coating includes: an adhesion reinforcing layer formed on a surface of the member; and a second layer formed on the adhesion reinforcing layer and having a composition represented by the following formula:

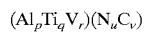

where $0 \leq p \leq 0.75$, $0.20 \leq q \leq 0.75$, $0.10 \leq r \leq 0.75$, $p+q+r=1$, $0.6 \leq u \leq 1$, and $u+v=1$

DETAILED DESCRIPTION OF THE PREFERRED EMBODIMENTS

The present inventors have conducted hard studies on a technique for giving excellent wear resistance to a hard coating coated member. As a result of studies, the present inventors have found that an excellent wear resistance can be attained by forming an adhesion reinforcing layer on the member as a first layer, and then, further forming a second layer thereon having a composition of $(Al_pTi_qV_r)(N_uC_v)$, where $0 \leq p \leq 0.75$, $0.20 \leq q \leq 0.75$, $0.10 \leq r \leq 0.75$, $p+q+r=1$, $0.6 \leq u \leq 1$, and $u+v=1$. The adhesion reinforcing layer shows an adhesion of 60N or larger in the scratch test defined in the appendix No. 2 of JIS H 8690. Contrary to this, the TiN layer which has been conventionally used as an adhesion reinforcing layer shows an adhesion of less than 60N under the same conditions as the above.

The first layer used as an adhesion reinforcing layer has a composition selected from the followings:

(1) $(Al_aTi_b)(N_c C_d)$, where $0.25 \leq a \leq 0.75$, $a+b=1$, $0.6 \leq c \leq 1$, and $c+d=1$;

(2) the groups 4A, 5A, and 6A metals such as Ti, Zr, Hf, V, Nb, Ta, Cr, Mo, and W; and (3) $Al_xTi_yV_z$, where $0 \leqq x \leqq 0.75$, $0<y<1$, $0<z<1$, and $x+y+z=1$.

The reason why the adhesion reinforcing layer having either one of the compositions (1) to (3) has high adhesion as compared with a TiN layer is not fully understood; however, the reason is assumed as follows. The adhesion reinforcing layer of either one of the compositions (1) to (3) has high toughness as compared with a TiN layer, and therefore, its ability of absorbing an energy generated by elastic and plastic deformation is higher than that of TiN layer. It is considered that the high energy absorption ability contributes to large adhesion of the adhesion reinforcing layer.

Next, the respective adhesion reinforcing layers of the compositions (1) to (3) will be described.

(1) $(Al_aTi_b)(N_cC_d)$, where $0.25 \leqq a \leqq 0.75$, $a+b=1$, $0.6 \leqq c \leqq 1$, and $c+d=1$ The reason why the value a is defined within the range of 0.25 to 0.75 is as follows. TiCN forms a cubic B1 (NaCl type) structure where Ti atoms, which are metallic elements, and C atoms or N atoms, which are non-metallic elements, are alternately arranged in a three-dimensional state. When atoms of V and Al are introduced into the structure of the TiCN, the site of Ti is substituted with Al and V. The resultant second layer has a composition of $(Al_p, Ti_q, V_r)(N, C)$ where $0 \leqq p \leqq 0.75$, $0.2 \leqq q \leqq 0.75$ and $0.10 \leqq r \leqq 0.75$ with the cubic B1 structure. In this case, the atomic radius of V and Al is smaller than that of Ti, and therefore, as the addition of V and Al to the TiCN is proceeded, the lattice constant of (Al, Ti, V)(N, C) decreases. On the other hand, in the formation of the first layer, TiCN is mixed and reacted with Al, and the resultant first layer has a composition of $(Al_a, Ti_b)(N, C)$ with the cubic B1 structure as well. The atomic radius of Al is smaller than that of Ti, and therefore, as the addition of Al to the TiCN is proceeded, the lattice constant of (Al, Ti)(N, C) decreases. The lattice constant of the first layer becomes substantially the same as the lattice constant of the second layer, and both of these layers have the cubic B1 structure. Only a small mismatching of lattices is created therebetween. The stress generated in the second layer is alleviated by the first layer, and as a result, the adhesion of the coating is enhanced. When the value a falls within the range of 0.25 to 0.75, the first layer of (Al, Ti)(N, C) itself has the highest hardness, and wear resistance of highest value is attained as well as excellent adhesion. If the value a exceeds 0.75, the crystal structure of $(Al_aTi_b)(N_c C_d)$ changes from a cubic structure (i.e. a cubic B1 structure) to a hexagonal structure which is different from the structure of the second layer of (Al, Ti, V)(N, C). The first layer loses adhesion, and in addition, its hardness is seriously impaired. Preferable range of the value a is 0.40 to 0.70, and more preferably 0.56 to 0.65, because higher adhesion and hardness can be attained.

The value c is required to fall within the range of 0.6 to 1. If the value c is less than 0.6, the first layer of $(Al_aTi_b)(N_cC_d)$ has low toughness, and sufficient adhesion cannot be attained.

(2) Group 4A, 5A, and 6A metals (Ti, Zr, Hf, V, Nb, Ta, Cr, Mo, and W)

The reason why the first layer as an adhesion reinforcing layer having a composition (2) contributes to an excellent wear resistance is considered as follows. The first layer made of group 4A, 5A, and 6A metals serves to alleviate the stress generated in the second layer having a composition of $(Al_pTi_qV_r)(N_uC_v)$ when it is formed between the member and the second layer. Due to the alleviated stress, excellent wear resistance is attained.

The group 4A, 5A, and 6A metals, which are used for forming the first layer, has a melting point as high as 1600° C. This value is higher than that of other metals. If a metal having a low melting point is used, a fused agglomerate is formed in the first layer during its formation, and the resultant first layer does not have a smooth and flat surface. Contrary to this, if a metal having a high melting point such as those of the present invention is used as an evaporation source for forming the first layer, a fused agglomerate is hard to be created. The resultant first layer has a flat and smooth surface, and has high adhesion.

(3) $Al_xTi_yV_z$, where $0 \leqq x \leqq 0.75$, $0<y<1$, $0<z<1$, and $x+y+z=1$ The formation of the first layer having a composition of $Al_xTi_yV_z$ between the member and the second layer of $(Al_pTi_qV_r)(N_uC_v)$ contributes to enhanced wear resistance. This is because first layer increases adhesion of the hard coating to the member. The reason why the formation of the first layer is effective in increasing adhesion is as follows: a) the stress generated in the second layer is alleviated; b) the AlTiV alloy or the TiV alloy (hereinafter, simply referred to as an (Al)TiV alloy) used for forming the first layer act as a nucleus for forming the second layer of (Al, Ti, V)(N, C), and as a result, an affinity between the first and second layers is increased; and c) a diffusion is created at the interface between the first layer with (Al)TiV alloy and the second layer of (Al, Ti, V)(N, C).

In order to attain high adhesion, the composition ratio of the first layer is preferably the same as that of the second layer of (Al, Ti, V)(N, C). To this end, in the composition of $Al_xTi_yV_z$, the value x is required to fall within the range of 0 to 0.75, preferably 0 or 0.25 to 0.75, more preferably 0.30 to 0.70, and the most preferably 0.40 to 0.60.

Next, the second layer will be described.

The second layer is required to have a composition of $(Al_pTi_qV_r)(N_uC_v)$, where $0 \leqq p \leqq 0.75$, $0.20 \leqq q \leqq 0.75$, $0.10 \leqq r \leqq 0.75$, and $p+q+r=1$, $0.6 \leqq u \leqq 1$, and $u+v=1$.

The reason why the second layer is required to have the composition defined as described above is as follows. As is known from the Examples later, when the values of p, q, r, u, and v respectively fall within the ranges described above, the second layer has high hardness. As a result, excellent wear resistance is attained. In addition, when the second layer is formed using V, V is effective in increasing lubricity and adhesive resistance to work materials to sufficient levels. The properties of the second layer are remarkably enhanced when the value q of $(Ti_qV_r)(N_uC_v)$ is made to fall within the range of 0.25 to 0.75, or the value p of $(Al_pTi_qV_r)(N_uC_v)$ is made to fall within the range of 0.20 to 0.75. It is also preferable that the value of p/q is made to fall within the range of 1.0 to 1.6, because higher hardness is obtained. The value u is required to fall within the range of 0.6 to 1. If the value u is smaller than 0.6, the toughness of the second layer is lowered, and sufficient adhesion cannot be attained accordingly.

If the first layer as an adhesion reinforcing layer has a composition of (1) $(Al_aTi_b)(N_cC_d)$, it is preferable to form an intermediate layer having a composition of any metal in the groups 4A, 5A, and 6A metals, or $Al_xTi_yV_z$ (where $0 \leqq x \leqq 0.75$, $0<y<1$, $0<z<1$, and $x+y+z=1$). As a result of forming the intermediate layer, higher adhesion can be attained.

The reasons why the formation of the intermediate layer of any metal in the groups 4A, 5A, and 6A metals is effective in increasing the adhesion of the coating are as follows: i) these metals have a melting point higher than 1600° C. If the intermediate layer is made of metals having a low melting point, a fused agglomerate is created during its formation, and the resultant intermediate layer does not have smooth and flat surface. Contrary to this, when the intermediate layer is formed using metals having a high melting point as an evaporation source, a fused agglomerates is hard to be created. The resultant intermediate layer has a flat and smooth surface; ii) these metals are active metals, and have high affinity with the first layer of (Al, Ti)N and the second layer of (Al, Ti, V)(N, C); and iii) these metals have lower hardness than those of the first layer of (Al, Ti)N and the second layer of (Al, Ti, V)(N, C), and therefore, have an effect of alleviating the stress generated in the first and second layers.

The reasons why the formation of the intermediate layer of $Al_xTi_yV_z$ between the first and the second layers is effective in increasing adhesion of the coating are as follows: i) the stress generated in the first and second layers is alleviated; ii) the AlTiV alloy of the intermediate layer acts as a nucleus for forming the second layer having a composition of (Al, Ti, V)(N, C), and the affinity therebetween is increased; and iii) a diffusion layer is formed at the interface between the intermediate layer and the second layer.

In order to attain high adhesion, the composition ratio of the intermediate layer is preferably close to that of the second layer of (Al, Ti, V)(N, C). To this end, the ratio between Al, Ti, V of the intermediate layer is preferably made to fall within the same range as that of the second layer. The value z (i.e. the amount of V) is made to fall within the range of 0 to 0.5. The value z can be zero, because V is expensive, and without V, sufficient adhesion is attained.

The thickness of the intermediate layer is preferably 500 nm or less. The hardness of the intermediate layer is lower than that of the second layer. Therefore, if the thickness of the intermediate layer is too large, the intermediate layer cannot resist friction generated in the cutting operation and the like, and may peel off in some cases.

In the case where the first layer has a composition (1) of $(Al_a, Ti_b)(N_c, C_d)$, the lower limit of the total thickness of the first and second layers is 0.8 μm. If the thickness is too small, the wear resistance becomes poor. The upper limit thereof is preferable 50 μm. If the thickness is too large, the coating is easily cracked and has poor strength. The preferable thickness of the first layer is 0.01 μm or larger, in order to attain sufficient adhesion, and the thickness of 0.4 μm is preferable in order to attain sufficient wear resistance. The preferable thickness of the second layer is 0.4 μm or larger in order to attain sufficient wear resistance.

In the case where the first layer has a composition of (2) the groups 4A, 5A, and 6A metals, or (3) $Al_xTi_yV_z$, the preferable lower limit of the thickness of the first layer is 5 nm. If the thickness is too small, the first layer does not sufficiently act as an adhesion reinforcing layer. The upper limit thereof is 500 nm. The first layer of the composition (2) or (3) has a lower hardness than the that of the second layer. If the thickness of the first layer is too large, the first layer cannot resist friction generated in the cutting operation and the like, and may peel off in some cases.

As described above, if the thickness of the hard coating is too small, sufficient wear resistance cannot be attained. Therefore, the preferable lower limit of the total thickness of the first and second layers is 0.8 μm. If the thickness of the hard coating is too large, the hard coating is easily cracked and loses its strength. Therefore, the preferable upper limit the total thickness of the first and second layers is 20 μm.

The recommended method for forming the hard coating on the member is arc-ion plating. The arc-ion plating method enhances the adhesion of the hard coating to the member by increasing ionization efficiency and reactivity, or applying a bias voltage to the member. In addition, it is recommended to use an alloy target having the same composition as that desired for the hard coating as a cathode. Through the use of the alloy target like this, the composition of the hard coating can be easily controlled.

The kind of the member to be coated with the hard coating is not specifically limited; however, the effect of the present invention is remarkable when the member has high hardness, and especially a cutting tool. In this case, if the thickness of the hard coating is too large, the cutting tool does not work well and its cutting edge may be chipped. To avoid such problems, the thickness of the hard coating is preferably 20 μm or smaller. The cutting tool prepared in accordance with the present invention has excellent wear resistance, because the adhesion of the hard coating to the member is excellent.

There also other hard members to which the present invention is applicable, such as such as carbides, high-speed steel tools, dies, cermets, ceramics and the like. As is the case of cutting tool, the members prepared in accordance with the present invention have excellent wear resistance, because the adhesion of the hard coating to the members is excellent.

Hereinafter, the present invention will be described in detail by way of example. It is to be understood that various changes and modifications will be apparent to those skilled in the art. Therefore, unless otherwise such changes and modifications depart from the scope of the present invention, they should be construed as being included therein.

EXAMPLES

Example 1

A carbide insert was put in an arc discharge ion-plating apparatus and the air in the chamber of the apparatus was evacuated, and heated to 400° C. for 60 minutes by a heater. Next, a bias voltage of −150V was applied to the carbide insert, while an $N_2$ gas of high purity or an $N_2/CH_4$ mixed gas was introduced into the chamber to a pressure of $7\times10^{-3}$ Torr. Then, an arc discharge was conducted by using an AlTi cathode having various compositions. As a result, a first layer having a composition shown in Tables 1 to 3 was formed. Then, an arc discharge was further conducted by using an AlTiV cathode having various compositions, and a second layer having a composition shown in Tables 1 to 3 was formed on the first layer. For some inserts, an intermediate layer of any metal in the group 4A, 5A, and 6A metals, or of AlTi(V) was formed between the first and second layers.

The hardness of the respective inserts was measured with a micro-Vickers hardness tester at a load of 0.98N. The measurement was conducted five times for each insert, and the average value was obtained. The test results are shown in Tables 1 to 3.

The inserts Nos. 1 to 7 and 12 to 19 in Table 1, the inserts Nos. 1 to 5 in Table 2, the inserts Nos. 1 to 6 in Table 3 are corresponded to Invention Examples.

The inserts Nos. 8 to 11 in Table 1, the inserts Nos. 6 to 10 in Table 2, the inserts Nos. 7 to 11 in Table 3 are corresponded to Comparative Examples.

The inserts Nos. 20 to 21 in Table 1, the inserts Nos. 11 to 12 in Table 2, the inserts Nos. 12 to 13 in Table 3 are corresponded to Prior Art Examples.

The inserts Nos. 1 to 7 and 13 to 20 corresponding to Invention Examples in Table 1 had high hardness. The inserts Nos. 8 to 11 in Table 1 corresponding to Comparative Examples where the composition of the second layer did not satisfy the definition of the present invention, had low hardness. The insert No. 12 corresponded to Comparative Example in Table 1 where the thickness of the hard coating was too large. The hard coating of the insert No. 12 in Table 1 cracked, and the hardness thereof could not be measured.

The inserts Nos. 21 corresponded to Prior Art Examples in Table 1 had low hardness. The hard coating of the insert No. 22 in Table 1 cracked, and the hardness thereof could not be measured.

The same results with the inserts in Table 1 could be obtained at the test of inserts in Tables 2 and 3.

Example 2

A hard coating was formed on a flat carbide substrate by repeating the steps of Example 1. The thickness and composition of the hard coating are shown in Tables 4 to 9. The composition of the hard coating was determined by electron probe X-ray microanalysis and Auger electron spectroscopy.

The resultant substrate was subjected to a scratch test to evaluate the adhesion of their coating layers. Specifically, the substrate was scratched and the change of the AE(Acoustic Emmision) signal was observed, and after the test, the surface of the substrate was observed by an optical microscope. The load when the damage was given to the coating was used to express its adhesion. The scratch test was conducted three times for each substrate, and the average value was obtained. The results are shown in Tables 4 to 9.

The substrates Nos. 1 to 14 and 21 to 25 in Table 4, the substrates Nos. 1 to 8 in Table 5, the substrates Nos. 1 to 13 in Table 6, the substrates Nos. 1 to 7 and 12 to 19 in Table 7, the substrates Nos. 1 to 5 in Table 8, and the substrates Nos. 1 to 6 in Table 9 are corresponded to Invention Examples.

The substrates Nos. 15 to 20 and 26 in Table 4, the substrates Nos. 9 to 11 in Table 5, the substrates Nos. 14 to 16 in Table 6, the substrates Nos. 8 to 11 and 20 to 21 in Table 7, the substrates Nos. 6 to 10 in Table 8, and the substrates Nos. 7 to 12 in Table 9 are corresponded to Comparative Examples.

The substrates Nos. 27 to 28 in Table 4, the substrates Nos. 12 to 13 in Table 5, the substrates Nos. 17 to 18 in Table 6, the substrates Nos. 22 to 24 in Table 7, the substrates Nos. 11 to 13 in Table 8, and the substrates Nos. 13 to 15 in Table 9 are corresponded to Prior Art Examples.

The substrates Nos. 1 to 14 corresponded to Invention Examples in Table 4 had high critical load, and the adhesion of their hard coatings to the substrates was excellent. In particular, the hard coatings of the substrates Nos. 21 to 25 had far excellent adhesion, because an intermediate layer of the present invention was formed between the first and second layers.

The substrates Nos. 8 to 10 in Table 4 corresponded to Comparative Examples where the composition of the first layer did not satisfy the definition of the present invention, and the adhesion of the hard coatings thereof was poor. The substrate No. 11 in Table 4 corresponded to Comparative Example where the thickness of the hard coating was too large, and the adhesion of the hard coating was very poor. The substrate No. 20 in Table 4 corresponded to Comparative Example where the intermediate layer contained excessive amount of Al. The substrate No. 21 in Table 4 corresponded to Comparative Example where the thickness of the intermediate layer was too large. The coating layers of the substrates Nos. 20 and 21 in Table 4 had poor adhesion to the substrates.

The substrates Nos. 22 and 23 in Table 4 corresponded to Prior Art Examples where no first layer was formed. The substrate No. 24 in Table 4 corresponded to Prior Art Example where the first layer of TiN was formed. The adhesion of the hard coatings of the substrates Nos. 22 to 24 in Table 4 was very poor as compared with that of the substrates prepared in Invention Examples.

The same results with the substrates in Table 4 could be obtained at the test of substrates in Tables 5 to 9.

Example 3

On a surface of mirror-finished hard ball having a diameter of 10 mm, a hard coating was formed by repeating the steps of Example 1. The composition and thickness of the hard coating was shown in Tables 10 to 15. The resultant hard ball was subjected to a ball-on-disk test to evaluate its wear resistance. The test was conducted using a disk made of S55C under the following conditions: load of 10N; a sliding speed of 1 m/sec.; temperature of 500° C.; and a sliding distance of 500 m. In the test, the wear amount and the friction coefficient of the ball were measured. The wear amount was a width of wear track created on the surface of the ball during the sliding test. The test results are shown in Tables 10 to 15.

The balls Nos. 1 to 14 and 21 to 25 in Table 10, the balls Nos. 1 to 8 in Table 11, the balls Nos. 1 to 13 in Table 12, the balls Nos. 1 to 7 and 16 to 23 in Table 13, the balls Nos. 1 to 5 in Table 14, and the balls Nos. 1 to 6 in Table 15 are corresponded to Invention Examples.

The balls Nos. 15 to 20 and 26 in Table 10, the balls Nos. 9 to 15 in Table 11, the balls Nos. 14 to 20 in Table 12, the balls Nos. 8 to 15 and 24 to 25 in Table 13, the balls Nos. 6 to 15 in Table 14, and the balls Nos. 7 to 17 in Table 15 are corresponded to Comparative Examples.

The balls Nos. 27 to 29 in Table 10, the balls Nos. 16 to 18 in Table 11, the balls Nos. 21 to 23 in Table 12, the balls Nos. 26 to 28 in Table 13, the balls Nos. 16 to 18 in Table 14, and the balls Nos. 18 to 20 in Table 15 are corresponded to Prior Art Examples.

It is understood that the wear amount of the balls corresponded to Invention Examples was small as compared with those of Comparative Examples and Prior Art Examples. This is because the adhesion of the hard coating of the balls prepared in Invention Examples was excellent. From this result, it is known that the balls prepared according to the present invention had excellent wear resistance.

Example 4

On a ball nosed endmill made of carbide (a radius: 5 mmR), a hard coating was formed by following the steps of Example 1. The composition and the thickness of the hard coating are shown in Tables 16 to 21. The resultant ball nosed endmill was subjected to a cutting test. The cutting test was conducted using S55C as a work material under the following conditions: a cutting speed of 98 m/min; a feed speed of 0.05 mm/tooth; a depth of cut of 0.5 mm at a pick feed; and a depth of cut in an axial direction of 4.0 mm. The material was cut by a down cutting with air-blow. When the cutting length reached 50 m, the wear at the corner and the boundary of the edges of the endmill were measured. The test results are shown in Tables 16 to 21.

The endmills Nos. 1 to 11 and 18 to 22 in Table 16, the endmills Nos. 1 to 8 in Table 17, the endmills Nos. 1 to 13 in Table 18, the endmills Nos. 1 to 7 and 16 to 23 in Table 19, the endmills Nos. 1 to 5 in Table 20, and the endmills Nos. 1 to 6 in Table 21 are corresponded to Invention Examples.

The endmills Nos. 12 to 17 and 23 in Table 16, the endmills Nos. 9 to 15 in Table 17, the endmills Nos. 14 to 20 in Table 18, the endmills Nos. 8 to 15 and 24 to 25 in Table 19, the endmills Nos. 6 to 15 in Table 20, and the endmills Nos. 7 to 17 in Table 21 are corresponded to Comparative Examples.

The endmills Nos. 24 to 26 in Table 16, the endmills Nos. 16 to 18 in Table 17, the endmills Nos. 21 to 23 in Table 18, the endmills Nos. 26 to 28 in Table 19, the endmills Nos. 16 to 18 in Table 20, and the endmills Nos. 18 to 20 in Table 21 are corresponded to Prior Art Examples.

The wear of the endmills corresponded to Invention Examples was small at corner and boundary of the edges as compared with those of Comparative Examples and Prior Art Examples. From this result, it is understood that the endmills prepared according to the present invention had excellent wear resistance.

Example 5

On the same type of ball nosed endmill made of carbide as that used in Example 4 (a radius: 5 mmR), a hard coating was formed by repeating the steps of Example 1. The composition and the thickness of the hard coating are shown in Tables 22 and 23. The resultant ball nosed endmill was subjected to a cutting test using JIS SKD61 (hardness: HRC52) as a work material under the following conditions: a cutting speed of 308 m/min; feed of 0.05 mm/tooth; a depth of cut of 0.5 mm at a pick feed; and a depth of cut in an axial direction of 4.0 mm. The material was cut by a down cutting with air-blow. When the cutting length reached 100 m, the wear at the corner and the boundary of the edges of the endmill were measured. The test results are shown in Tables 22 and 23.

The endmills Nos. 1 to 4 in Table 22 and the endmills Nos. 1 to 2 in Table 23 are corresponded to Invention Examples. The endmills Nos. 5 to 6 in Table 22 and the endmills Nos. 3 to 4 in Table 23 are corresponded to Prior Art Examples.

The endmills corresponded to Invention Examples had a hard coating with first layer of (Al, Ti)N and a second layer of (Ti, V)N or (Al, Ti, V)N formed on the first layer, and had a intermediate layer between the first layer and the second layer as a preferable embodiment. Thus-structured endmills corresponded to Invention Examples had an excellent wear resistance even in the case of cutting hard work material such as JIS SKD61.

Example 6

On the surface of a JIS standard straight shank drill made of high speed steel (an outer diameter: φ6.0 mm), a hard coating was formed by repeating the steps of Example 1. The composition and the thickness of the hard coating are shown in Tables 24 to 29. The resultant straight shank drill was subjected to a cutting test using S50C as a work material to be cut under the following conditions: a cutting speed of 30 m/min; a feed of 0.18 mm/rev; and a lubricant of emulsion. The work material was drilled with the drill to make holes of 16 mm in depth. The drilling was continued until the lifetime of the drill ended, and the number of holes was counted. The test was conducted three times per material, and the average of the hole numbers was obtained. The test results are shown in Tables 24 to 29.

The drills Nos. 1 to 11 and 17 to 21 in Table 24, the drills Nos. 1 to 8 in Table 25, the drills Nos. 1 to 13 in Table 26, the drills Nos. 1 to 7 and 16 to 23 in Table 27, the drills Nos. 1 to 5 in Table 28, and the drills Nos. 1 to 6 in Table 29 are corresponded to Invention Examples.

The drills Nos. 12 to 16 and 22 in Table 24, the drills Nos. 9 to 15 in Table 25, the drills Nos. 14 to 20 in Table 26, the drills Nos. 8 to 15 and 24 to 25 in Table 27, the drills Nos. 6 to 15 in Table 28, and the drills Nos. 7 to 17 in Table 29 are corresponded to Comparative Examples.

The drills Nos. 23 to 26 in Table 24, the drills Nos. 16 to 18 in Table 25, the drills Nos. 21 to 23 in Table 26, the drills Nos. 26 to 28 in Table 27, the drills Nos. 16 to 18 in Table 28, and the drills Nos. 18 to 20 in Table 29 are corresponded to Prior Art Examples.

The drills corresponded to Invention Examples had far longer tool life as compared with those of Comparative Examples and Prior Art Examples. That is, larger numbers of holes were made in the case of using drills prepared in Invention Examples, as compared with drills prepared in Comparative Examples and Prior Art Examples. This test result shows that the drills prepared according to the present invention had excellent wear resistance and adhesion.

Example 7

On a milling insert made of carbonnitride titanium-based cermet (SDKN 42, JIS P10), a hard coating was formed by repeating the steps of Example 1. The composition and the following of the hard coating are shown in Tables 30 to 35. The resultant milling insert was subjected to a cutting test using S50C as a work material to be cut in a dry process under the following conditions: a cutting speed of 200 m/min; a feed of 0.15 mm/tooth; and a depth of cut of 2.0 mm. When the cutting length reached 50 m, the flank wear was measured. The test results are shown in Tables 30 to 35.

The inserts Nos. 1 to 11 and 17 to 21 in Table 30, the inserts Nos. 1 to 8 in Table 31, the inserts Nos. 1 to 13 in Table 32, the inserts Nos. 1 to 7 and 16 to 23 in Table 33, the inserts Nos. 1 to 5 in Table 34, and the inserts Nos. 1 to 6 in Table 35 are corresponded to Invention Examples.

The inserts Nos. 12 to 16 and 22 in Table 30, the inserts Nos. 9 to 15 in Table 31, the inserts Nos. 14 to 20 in Table 32, the inserts Nos. 8 to 15 and 24 to 25 in Table 33, the inserts Nos. 6 to 15 in Table 34, and the inserts Nos. 7 to 17 in Table 35 are corresponded to Comparative Examples.

The inserts Nos. 23 to 26 in Table 30, the inserts Nos. 16 to 18 in Table 31, the inserts Nos. 21 to 23 in Table 32, the inserts Nos. 26 to 28 in Table 33, the inserts Nos. 16 to 18 in Table 34, and the inserts Nos 18 to 20 in Table 35 are corresponded to Prior Art Examples.

The flank wear of the inserts corresponded to Invention Examples was very small as compared with those of Comparative Examples and Prior Art Examples. This result shows that the inserts prepared according to the present invention had excellent wear resistance and long tool life.

Example 8

On a turning insert made of $Al_2O_3$—TiC ceramics, a hard coating was formed by following the steps of Example 1. The composition and the thickness of the hard coating are shown in Tables 36 to 41. The resultant turning insert was subjected to a cutting test by a continuous turning in a dry process using JIS FCD 45 as a work material under the following cutting conditions: cutting speed of 300 m/min; feed of 0.15 mm/rev; and a depth of cut of 0.3 mm. When the cutting length reached 50 m, the flank wear was measured. The test results are shown in Tables 36 to 41.

The inserts Nos. 1 to 11 and 17 to 21 in Table 36, the inserts Nos. 1 to 8 in Table 37, the inserts Nos. 1 to 13 in Table 38, the inserts Nos. 1 to 7 and 16 to 23 in Table 39, the inserts Nos. 1 to 5 in Table 40, and the inserts Nos. 1 to 6 in Table 41 are corresponded to Invention Examples.

The inserts Nos. 12 to 16 and 22 in Table 36, the inserts Nos. 9 to 15 in Table 37, the inserts Nos. 14 to 20 in Table 38, the inserts Nos. 8 to 15 and 24 to 25 in Table 39, the inserts Nos. 6 to 15 in Table 40, and the inserts Nos. 7 to 17 in Table 41 are corresponded to Comparative Examples.

The inserts Nos. 23 to 26 in Table 36, the inserts Nos. 16 to 18 in Table 37, the inserts Nos. 21 to 23 in Table 38, the inserts Nos. 26 to 28 in Table 39, the inserts Nos. 16 to 18 in Table 40, and the inserts Nos. 18 to 20 in Table 41 are corresponded to Prior Art Examples.

The flank wear of the inserts corresponded to Invention Examples was very small as compared with those of Comparative Examples and Prior Art Examples. This result shows that the inserts prepared according to the present invention had an excellent wear resistance and long tool life.

According to the present invention, the hard coating has high adhesion to the member, and thus-formed member has excellent wear resistance while maintaining other excellent properties which have been conventionally attained. The advantages of excellent wear resistance and high adhesion of hard coating are especially remarkable when the present invention is applied to a cutting tool. The cutting tool prepared according to the present invention exhibits excellent wear resistance in both cases where it is used for cutting work materials with high hardness and those with low hardness. In particular, in the case of cutting work materials with low hardness, the cutting tool exhibits higher wear resistance than those of prior art. Therefore, the cutting tools prepared according to the present invention is applicable for cutting various work materials with high to low hardness levels.

TABLE 1

| No | First layer Composition | T.L.*1 ($\mu$m) | Intermediate layer Composition | T.L. (nm) | Second layer Composition | T.L. ($\mu$m) | Hardness |
|---|---|---|---|---|---|---|---|
| 1 | $Al_{0.6}Ti_{0.4})N$ | 5 | None | — | $Al_{0.4}Ti_{0.25}V_{0.35})N$ | 5 | 3317 |
| 2 | $Al_{0.6}Ti_{0.4})(N_{0.6}C_{0.4})$ | 2 | None | — | $Al_{0.4}Ti_{0.4}V_{0.2})(N_{0.5}C_{0.2})$ | 10 | 3320 |
| 3 | $Al_{0.5}Ti_{0.5})N$ | 10 | None | — | $Al_{0.2}Ti_{0.3}V_{0.5})N$ | 35 | 3275 |
| 4 | $Al_{0.4}Ti_{0.6})N$ | 1 | None | — | $Al_{0.6}Ti_{0.2}V_{0.2})N$ | 3 | 3297 |
| 5 | $Al_{0.7}Ti_{0.3})N$ | 0.5 | None | — | $Al_{0.3}Ti_{0.6}V_{0.1})N$ | 0.5 | 3257 |
| 6 | $Al_{0.25}Ti_{0.75})(N_{0.8}C_{0.2})$ | 3 | None | — | $Al_{0.2}Ti_{0.4}V_{0.5})N$ | 5 | 3128 |
| 7 | $Al_{0.75}Ti_{0.25})N$ | 10 | None | — | $Al_{0.6}Ti_{0.2}V_{0.2})N$ | 20 | 3167 |
| 8 | $Al_{0.6}Ti_{0.4})(N_{0.6}C_{0.4})$ | 5 | None | — | $Al_{0.15}Ti_{0.8}V_{0.05})(N_{0.6}C_{0.4})$ | 5 | 2001 |
| 9 | $Al_{0.5}Ti_{0.5})(N_{0.8}C_{0.2})$ | 2 | None | — | $Al_{0.8}Ti_{0.15}V_{0.05})(N_{0.8}C_{0.2})$ | 5 | 2427 |
| 10 | $Al_{0.4}Ti_{0.6})(N_{0.8}C_{0.2})$ | 4 | None | — | $Al_{0.4}Ti_{0.4}V_{0.2})(N_{0.4}C_{0.6})$ | 10 | 2460 |
| 11 | $Al_{0.6}Ti_{0.4})N$ | 20 | None | — | $Al_{0.4}Ti_{0.4}V_{0.2})N$ | 40 | —*2 |
| 12 | $Al_{0.6}Ti_{0.4})N$ | 2 | Ti | 50 | $Al_{0.4}Ti_{0.4}V_{0.35})N$ | 2 | 3300 |
| 13 | $Al_{0.5}Ti_{0.5})N$ | 5 | Ta | 5 | $Al_{0.4}Ti_{0.4}V_{0.2})N$ | 2 | 3298 |
| 14 | $Al_{0.4}Ti_{0.6})N$ | 10 | W | 500 | $Al_{0.4}Ti_{0.4}V_{0.2})N$ | 10 | 3320 |
| 15 | $Al_{0.6}Ti_{0.4})N$ | 1 | $Al_{0.4}Ti_{0.25}V_{0.35}$ | 10 | $Al_{0.4}Ti_{0.26}V_{0.36})N$ | 3 | 3314 |
| 16 | $Al_{0.5}Ti_{0.5})N$ | 3 | $Al_{0.5}Ti_{0.5}$ | 100 | $Al_{0.4}Ti_{0.4}V_{0.2}N$ | 1 | 3308 |
| 17 | $Al_{0.4}Ti_{0.6})N$ | 2 | $Al_{0.75}Ti_{0.2}V_{0.05}$ | 300 | $Al_{0.4}Ti_{0.4}V_{0.2}N$ | 5 | 3287 |
| 18 | $Al_{0.3}Ti_{0.7})(N_{0.8}C_{0.2})$ | 10 | $Al_{0.2}Ti_{0.75}V_{0.05}$ | 50 | $Al_{0.2}Ti_{0.3}V_{0.5}N$ | 3 | 3311 |
| 19 | $Al_{0.7}Ti_{0.3})N$ | 5 | $Al_{0.25}Ti_{0.25}V_{0.5}$ | 20 | $(Al_{0.6}Ti_{0.2}V_{0.2})N$ | 5 | 3290 |
| 20 | None | — | None | — | $(Al_{0.6}Ti_{0.4})(N0.6C_{0.2})$ | 5 | 2520 |
| 21 | None | — | None | — | $(Al_{0.4}Ti_{0.25}V_{0.35})N$ | 3 | —*2 |

*1: T.L. means "thickness of layer".
*2: Crack occurred. Measurement was impossible.

TABLE 2

| No | First layer Composition | T.L. (nm) | Second layer Composition | T.L. ($\mu$m) | Hardness |
|---|---|---|---|---|---|
| 1 | Ti | 5 | $(Al_{0.4}Ti_{0.25}V_{0.35})N$ | 5 | 3315 |
| 2 | Ti | 150 | $(Al_{0.4}Ti_{0.4}V_{0.2})(N_{0.8}C_{0.4})$ | 10 | 3280 |
| 3 | Zr | 500 | $(Al_{0.6}Ti_{0.2}V_{0.2})N$ | 20 | 3153 |
| 4 | Ta | 200 | $(Al_{0.3}Ti_{0.6}V_{0.1})N$ | 1 | 3118 |
| 5 | W | 15 | $(Al_{0.2}Ti_{0.3}V_{0.5})N$ | 8 | 3093 |
| 6 | Hf | 100 | $(Al_{0.5}Ti_{0.15}V_{0.35})N$ | 5 | 2513 |
| 7 | Ta | 500 | $(Al_{0.8}Ti_{0.15}V_{0.05})N$ | 15 | 2287 |
| 8 | Mo | 50 | $(Al_{0.15}Ti_{0.8}V_{0.05})N$ | 18 | 2008 |
| 9 | Ti | 600 | $(Al_{0.4}Ti_{0.25}V_{0.35})N$ | 10 | 3309 |
| 10 | Cr | 2 | $(Al_{0.4}Ti_{0.25}V_{0.35})N$ | 2 | —*3 |
| 11 | None | — | $(Al_{0.6}Ti_{0.4})(N_{0.8}C_{0.2})$ | 5 | 2520 |
| 12 | None | — | $(Al_{0.5}Ti_{0.25}V_{0.35})N$ | 3 | —*3 |

*3: Hard coatig was peeled off. Measurement could not be carried out.

TABLE 3

| No | First layer Composition | T.L. (nm) | Second layer Composition | T.L. (μm) | Hardness |
|---|---|---|---|---|---|
| 1 | $Al_{0.4}Ti_{0.25}V_{0.35}$ | 5 | $(Al_{0.4}Ti_{0.25}V_{0.35})N$ | 5 | 3315 |
| 2 | $Al_{0.4}Ti_{0.4}V_{0.2}$ | 50 | $(Al_{0.4}Ti_{0.25}V_{0.35})N$ | 10 | 3420 |
| 3 | $Al_{0.4}Ti_{0.25}V_{0.35}$ | 150 | $(Al_{0.4}Ti_{0.4}V_{0.2})(N_{0.5}C_{0.4})$ | 20 | 3280 |
| 4 | $Al_{0.3}Ti_{0.6}V_{0.1}$ | 500 | $(Al_{0.6}Ti_{0.2}V_{0.2})N$ | 15 | 3153 |
| 5 | $Al_{0.2}Ti_{0.3}V_{0.5}$ | 200 | $(Al_{0.3}Ti_{0.6}V_{0.1})N$ | 1 | 3118 |
| 6 | $Al_{0.6}Ti_{0.2}V_{0.2}$ | 15 | $Al_{0.2}Ti_{0.3}V_{0.5})N$ | 8 | 3093 |
| 7 | $Al_{0.4}Ti_{0.25}V_{0.35}$ | 100 | $(Al_{0.2}Ti_{0.15}V_{0.35})N$ | 5 | 2513 |
| 8 | $Al_{0.4}Ti_{0.4}V_{0.2}$ | 500 | $(Al_{0.8}Ti_{0.14}V_{0.05})N$ | 30 | 2287 |
| 9 | $Al_{0.4}Ti_{0.4}V_{0.2}$ | 50 | $(Al_{0.15}Ti_{0.8}V_{0.05})N$ | 40 | 2008 |
| 10 | $Al_{0.4}Ti_{0.4}V_{0.2}$ | 600 | $(Al_{0.4}Ti_{0.25}V_{0.35})N$ | 10 | 3309 |
| 11 | $Al_{0.4}Ti_{0.4}V_{0.2}$ | 2 | $(Al_{0.4}Ti_{0.25}V_{0.35})N$ | 2 | —*3 |
| 12 | None | — | $(Al_{0.6}Ti_{0.4})(N_{0.8}C_{0.2})$ | 5 | 2520 |
| 13 | None | — | $(Al_{0.4}Ti_{0.25}V_{0.35})N$ | 3 | —*3 |

*3: Hard coating was peeled off. Measurement could not be carried out.

TABLE 4

| No. | First layer Composition | T.L.*1 (μm) | Intermediate layer Composition | T.L. (nm) | Second layer Composition | T.L. (μm) | Critical load (N) |
|---|---|---|---|---|---|---|---|
| 1 | $(Al_{0.6}Ti_{0.4})N$ | 2 | None | — | $(Ti_{0.7}V_{0.3})N$ | 0.5 | 76.3 |
| 2 | $(Al_{0.6}Ti_{0.4})N$ | 5 | None | — | $(Ti_{0.7}V_{0.3})(N_{0.8}C_{0.2})$ | 2 | 78.1 |
| 3 | $(Al_{0.6}Ti_{0.4})(N_{0.6}C_{0.2})$ | 2.5 | None | — | $(Ti_{0.7}V_{0.3})N$ | 5 | 76.8 |
| 4 | $(Al_{0.6}Ti_{0.4})N$ | 5 | None | — | $(Ti_{0.8}V_{0.4})N$ | 5 | 81.3 |
| 5 | $(Al_{0.6}Ti_{0.4})N$ | 5 | None | — | $(Ti_{0.6}V_{0.4})(N_{0.6}C_{0.4})$ | 5 | 76.5 |
| 6 | $(Al_{0.6}Ti_{0.4})(N_{0.6}C_{0.4})$ | 5 | None | — | $(Ti_{0.6}V_{0.4})N$ | 5 | 80.6 |
| 7 | $(Al_{0.6}Ti_{0.4})N$ | 2 | None | — | $(Ti_{0.8}V_{0.5})N$ | 3 | 84.3 |
| 8 | $(Al_{0.6}Ti_{0.4})N$ | 5 | None | — | $(Ti_{0.8}V_{0.5})N$ | 15 | 83.5 |
| 9 | $(Al_{0.6}Ti_{0.4})N$ | 20 | None | — | $(Ti_{0.8}V_{0.5})N$ | 20 | 82.7 |
| 10 | $(Al_{0.6}Ti_{0.4})N$ | 5 | None | — | $(Ti_{0.4}V_{0.6})N$ | 3 | 79.5 |
| 11 | $(Al_{0.6}Ti_{0.4})N$ | 5 | None | — | $(Ti_{0.3}V_{0.7})N$ | 5 | 77.9 |
| 12 | $(Al_{0.3}Ti_{0.7})N$ | 1 | None | — | $(Ti_{0.8}V_{0.5})N$ | 3 | 77.6 |
| 13 | $(Al_{0.45}Ti_{0.55})N$ | 2 | None | — | $(Ti_{0.8}V_{0.5})N$ | 10 | 78.3 |
| 14 | $(Al_{0.7}Ti_{0.3})N$ | 3 | None | — | $(Ti_{0.5}V_{0.5})N$ | 5 | 81.5 |
| 15 | $(Al_{0.8}Ti_{0.4})N$ | 2 | None | — | $(Ti_{0.8}V_{0.2})N$ | 3 | 67.0 |
| 16 | $(Al_{0.6}Ti_{0.4})N$ | 2 | None | — | $(Ti_{0.2}V_{0.5})N$ | 3 | 70.1 |
| 17 | $(Al_{0.2}Ti_{0.8})N$ | 1 | None | — | $(Ti_{0.8}V_{0.5})N$ | 5 | 58.2 |
| 18 | $(Al_{0.8}Ti_{0.2})N$ | 1 | None | — | $(Ti_{0.6}V_{0.5})N$ | 5 | 48.3 |
| 19 | $(Al_{0.45}Ti_{0.55})N$ | 20 | None | — | $(Ti_{0.8}V_{0.5})N$ | 40 | —*6 |
| 20 | $(Al_{0.7}Ti_{0.3})N$ | 0.2 | None | — | $(Ti_{0.8}V_{0.5})N$ | 0.3 | 73.0 |
| 21 | $(Al_{0.6}Ti_{0.4})N$ | 2 | Ti | 50 | $(Ti_{0.8}V_{0.5})N$ | 2 | 85.3 |
| 22 | $(Al_{0.5}Ti_{0.5})N$ | 5 | Ta | 5 | $(Ti_{0.8}V_{0.5})N$ | 2 | 84.9 |
| 23 | $(Al_{0.6}Ti_{0.4})N$ | 10 | W | 500 | $(Ti_{0.4}V_{0.6})N$ | 10 | 85.8 |
| 24 | $(Al_{0.6}Ti_{0.4})N$ | 3 | $Ti_{0.5}V_{0.5}$ | 100 | $(Ti_{0.8}V_{0.8})N$ | 1 | 87.5 |
| 25 | $(Al_{0.6}Ti_{0.4})N$ | 5 | $Ti_{0.6}V_{0.4}$ | 20 | $(Ti_{0.4}V_{0.6})N$ | 5 | 86.3 |
| 26 | $(Al_{0.6}Ti_{0.4})N$ | 5 | Ti | 600 | $(Ti_{0.8}V_{0.8})N$ | 5 | 56.3 |
| 27 | None | — | None | — | $(Ti_{0.3}V_{0.7})N$ | 5 | 51.8 |
| 28 | TiN | 1 | None | — | $(Ti_{0.3}V_{0.7})N$ | 5 | 57.9 |

*1: T.L. means "thickness of layer".
*6: Hard coating was damaged.

TABLE 5

| No | First layer Composition | T.L. (nm) | Second layer Composition | T.L. (μm) | Critical load (N) |
|---|---|---|---|---|---|
| 1 | Ti | 50 | $(Ti_{0.5}V_{0.5})N$ | 5 | 84.2 |
| 2 | V | 150 | $(Ti_{0.6}V_{0.4})(N_{0.8}C_{0.2})$ | 2 | 83.5 |
| 3 | Ta | 500 | $(Ti_{0.4}V_{0.6})N$ | 10) | 82.6 |
| 4 | Cr | 5 | $(Ti_{0.5}V_{0.5})(N_{0.6}C_{0.4})$ | 1 | 83.8 |
| 5 | Mo | 300 | $(Ti_{0.6}V_{0.4})(N_{0.8}C_{0.2})$ | 20 | 82.5 |
| 6 | Zr | 100 | $(Ti_{0.4}V_{0.6})N$ | 15 | 82.7 |
| 7 | Ti | 100 | $(Ti_{0.7}V_{0.3})N$ | 5 | 80.7 |
| 8 | W | 50 | $(Ti_{0.4}V_{0.7})(N_{0.8}C_{0.2})$ | 10 | 79.6 |
| 9 | Ti | 600 | $(Ti_{0.6}V_{0.4})N$ | 5 | 58.3 |
| 10 | Zr | 2 | $(Ti_{0.4}V_{0.6})(N_{0.6}C_{0.4})$ | 15 | 52.2 |

TABLE 5-continued

| | First layer | | Second layer | | Critical |
|---|---|---|---|---|---|
| No | Composition | T.L. (nm) | Composition | T.L. ($\mu$m) | load (N) |
| 11 | Ta | 50 | $(Ti_{0.5}V_{0.5})N$ | 25 | 38.3 |
| 12 | None | — | $(Ti_{0.3}V_{0.7})N$ | 5 | 51.8 |
| 13 | TiN | 1000 | $(Ti_{0.3}V_{0.7})N$ | 5 | 57.9 |

TABLE 6

| | First layer | | Second layer | | Critical |
|---|---|---|---|---|---|
| No | Composition | T.L. (nm) | Composition | T.L. ($\mu$m) | load (N) |
| 1 | $Ti_{0.5}V_{0.5}$ | 50 | $(Ti_{0.5}V_{0.5})N$ | 5 | 84.5 |
| 2 | $Ti_{0.6}V_{0.4}$ | 150 | $(Ti_{0.5}V_{0.4})N$ | 10 | 84.3 |
| 3 | $Ti_{0.4}V_{0.6}$ | 500 | $(Ti_{0.4}V_{0.6})N$ | 15 | 84.2 |
| 4 | $Ti_{0.4}V_{0.5}$ | 5 | $(Ti_{0.5}V_{0.4})N$ | 1 | 83.7 |
| 5 | $Ti_{0.3}V_{0.7}$ | 50 | $(Ti_{0.6}V_{0.5})N$ | 5 | 83.1 |
| 6 | $Ti_{0.7}V_{0.3}$ | 200 | $(Ti_{0.5}V_{0.5})N$ | 10 | 82.8 |
| 7 | $Ti_{0.8}V_{0.2}$ | 100 | $(Ti_{0.5}V_{0.5})N$ | 20 | 82.2 |
| 8 | $Ti_{0.2}V_{0.8}$ | 300 | $(Ti_{0.5}V_{0.5})N$ | 5 | 82.0 |
| 9 | Ti | 20 | $(Ti_{0.5}V_{0.4})N$ | 8 | 80.5 |
| 10 | V | 50 | $(Ti_{0.4}V_{0.6})N$ | 5 | 81.4 |
| 11 | $Ti_{0.7}V_{0.3}$ | 500 | $(Ti_{0.7}V_{0.3})N$ | 10 | 83.3 |
| 12 | V | 150 | $(Ti_{0.7}V_{0.3})N$ | 3 | 78.5 |
| 13 | Ti | 100 | $(Ti_{0.3}V_{0.7})N$ | 5 | 78.1 |
| 14 | $Ti_{0.5}V_{0.4}$ | 600 | $(Ti_{0.6}V_{0.4})N$ | 5 | 58.3 |
| 15 | $Ti_{0.4}V_{0.6}$ | 2 | $(Ti_{0.4}V_{0.6})(N_{0.6}C_{0.4})$ | 15 | 52.4 |
| 16 | $Ti_{0.5}V_{0.5}$ | 50 | $(Ti_{0.5}V_{0.5})N$ | 25 | 38.2 |
| 17 | None | — | $(Ti_{0.3}V_{0.7})N$ | 5 | 51.8 |
| 18 | TiN | 1000 | $(Ti_{0.3}V_{0.7})N$ | 5 | 57.9 |

TABLE 7

| | First layer | | Intermediate layer | | Second layer | | Critical |
|---|---|---|---|---|---|---|---|
| No | Composition | T.L. ($\mu$m) | Composition | T.L. (nm) | Composition | T.L. ($\mu$m) | load (N) |
| 1 | $Al_{0.6}Ti_{0.4})N$ | 5 | None | — | $Al_{0.4}Ti_{0.25}V_{0.35})N$ | 5 | 83.3 |
| 2 | $Al_{0.6}Ti_{0.4})(N_{0.6}C_{0.4})$ | 2 | None | — | $Al_{0.4}Ti_{0.4}V_{0.2})(N_{0.8}C_{0.2})$ | 10 | 82.5 |
| 3 | $Al_{0.5}Ti_{0.5})N$ | 10 | None | — | $Al_{0.2}Ti_{0.3}V_{0.6})N$ | 35 | 81.2 |
| 4 | $Al_{0.4}Ti_{0.6})N$ | 1 | None | — | $Al_{0.6}Ti_{0.2}V_{0.2})N$ | 3 | 79.5 |
| 5 | $Al_{0.7}Ti_{0.3})N$ | 0.5 | None | — | $Al_{0.3}Ti_{0.6}V_{0.1})N$ | 0.5 | 80.4 |
| 6 | $Al_{0.25}Ti_{0.75})(N_{0.8}C_{0.2})$ | 3 | None | — | $Al_{0.2}Ti_{0.3}V_{0.6})N$ | 5 | 79.9 |
| 7 | $Al_{0.75}Ti_{0.25})N$ | 10 | None | — | $Al_{0.6}Ti_{0.2}V_{0.2})N$ | 20 | 78.8 |
| 8 | $Al_{0.2}Ti_{0.8})N$ | 5 | None | — | $Al_{0.4}Ti_{0.25}V_{0.35})N$ | 5 | 60.3 |
| 9 | $Al_{0.8}Ti_{0.2})N$ | 10 | None | — | $Al_{0.4}Ti_{0.4}V_{0.2})(N_{0.8}C_{0.2})$ | 10 | 49.8 |
| 10 | $Al_{0.5}Ti_{0.5}(N_{0.4}C_{0.6})$ | 10 | None | — | $Al_{0.2}Ti_{0.3}V_{0.5})N$ | 20 | 58.1 |
| 11 | $Al_{0.6}Ti_{0.4})N$ | 20 | None | — | $Al_{0.4}Ti_{0.2}V_{0.2})N$ | 40 | 32.8 |
| 12 | $Al_{0.6}Ti_{0.4})N$ | 2 | Ti | 50 | $Al_{0.4}Ti_{0.25}V_{0.35})N$ | 2 | 85.2 |
| 13 | $Al_{0.5}Ti_{0.5})N$ | 5 | Ta | 5 | $Al_{0.4}Ti_{0.4}V_{0.2})N$ | 2 | 84.5 |
| 14 | $Al_{0.4}Ti_{0.6})N$ | 10 | W | 500 | $Al_{0.4}Ti_{0.4}V_{0.2})N$ | 10 | 83.7 |
| 15 | $Al_{0.6}Ti_{0.4})N$ | 1 | $Al_{0.4}Ti_{0.25}V_{0.35}$ | 10 | $Al_{0.4}Ti_{0.25}V_{0.35})N$ | 3 | 86.4 |
| 16 | $Al_{0.4}Ti_{0.6})N$ | 3 | $Al_{0.5}Ti_{0.6}$ | 100 | $Al_{0.4}Ti_{0.4}V_{0.2})N$ | 1 | 85.6 |
| 17 | $Al_{0.4}Ti_{0.6})N$ | 2 | $Al_{0.75}Ti_{0.2}V_{0.05}$ | 300 | $Al_{0.4}Ti_{0.4}V_{0.2})N$ | 5 | 84.2 |
| 18 | $Al_{0.3}Ti_{0.7})(N_{0.5}C_{0.2})$ | 10 | $Al_{0.2}Ti_{0.75}V_{0.05}$ | 50 | $Al_{0.2}Ti_{0.3}V_{0.5})N$ | 3 | 83.9 |
| 19 | $Al_{0.7}Ti_{0.3})N$ | 5 | $Al_{0.25}Ti_{0.25}V_{0.5}$ | 20 | $Al_{0.6}Ti_{0.2}V_{0.2})N$ | 5 | 84.5 |
| 20 | $(Al_{0.4}Ti_{0.6})N$ | 10 | $Al_{0.9}Ti_{0.1}$ | 50 | $Al_{0.3}Ti_{0.6}V_{0.1})N$ | 10 | 61.7 |
| 21 | $(Al_{0.6}Ti_{0.5})N$ | 5 | Ti | 600 | $Al_{0.2}Ti_{0.3}V_{0.5})N$ | 5 | 57.6 |
| 22 | None | — | None | — | $(Al_{0.4}Ti_{0.4})(N_{0.8}C_{0.2})$ | 5 | 60.3 |
| 23 | None | — | None | — | $(Al_{0.4}Ti_{0.25}V_{0.35})N$ | 3 | 35.2 |
| 24 | TiN | 1 | None | — | $(Al_{0.4}Ti_{0.25}V_{0.35})N$ | 8 | 51.2 |

TABLE 8

| | First layer | | Second layer | | Critical |
|---|---|---|---|---|---|
| No | Composition | T.L. (nm) | Composition | T.L. ($\mu$m) | load (N) |
| 1 | Ti | 5 | $(Al_{0.4}Ti_{0.25}V_{0.38})N$ | 5 | 83.5 |
| 2 | Ti | 150 | $(Al_{0.4}Ti_{0.4}V_{0.2})(N_{0.6}C_{0.4})$ | 10 | 82.8 |
| 3 | Zr | 500 | $(Al_{0.6}Ti_{0.2}V_{0.2})N$ | 20 | 81.5 |
| 4 | Ta | 200 | $(Al_{0.3}Ti_{0.6}V_{0.1})N$ | 1 | 79.6 |
| 5 | W | 15 | $(Al_{0.2}Ti_{0.3}V_{0.5})N$ | 8 | 78.7 |
| 6 | Ti | 600 | $(Al_{0.4}Ti_{0.25}V_{0.35})N$ | 10 | 54.2 |
| 7 | Ta | 800 | $(Al_{0.4}Ti_{0.25}V_{0.35})N$ | 10 | 43.3 |
| 8 | Cr | 2 | $(Al_{0.4}Ti_{0.25}V_{0.36})N$ | 2 | 44.4 |
| 9 | W | 1 | $(Al_{0.4}Ti_{0.4}V_{0.2})(N_{0.6}C_{0.2})$ | 10 | 42.1 |
| 10 | Hf | 10 | $(Al_{0.4}Ti_{0.25}V_{0.35})N$ | 25 | 38.5 |
| 11 | None | — | $(Al_{0.6}Ti_{0.4})(N_{0.8}C_{0.2})$ | 5 | 60.3 |
| 12 | None | — | $(Al_{0.4}Ti_{0.25}V_{0.35})N$ | 3 | 35.2 |
| 13 | TiN | 1000 | $(Al_{0.4}Ti_{0.25}V_{0.35})N$ | 8 | 51.2 |

TABLE 9

| | First layer | | Second layer | | Critical |
|---|---|---|---|---|---|
| No | Composition | T.L. (nm) | Composition | T.L. ($\mu$m) | load (N) |
| 1 | $Al_{0.4}Ti_{0.25}V_{0.35}$ | 5 | $(Al_{0.4}Ti_{0.25}V_{0.35})N$ | 5 | 84.8 |
| 2 | $Al_{0.4}Ti_{0.4}V_{0.2}$ | 50 | $(Al_{0.4}Ti_{0.25}V_{0.35})N$ | 10 | 83.3 |
| 3 | $Al_{0.4}Ti_{0.25}V_{0.35}$ | 150 | $(Al_{0.4}Ti_{0.4}V_{0.2})(N_{0.6}C_{0.4})$ | 20 | 84.1 |
| 4 | $Al_{0.4}Ti_{0.4}V_{0.1}$ | 500 | $(Al_{0.6}Ti_{0.2}V_{0.2})N$ | 15 | 82.8 |
| 5 | $Al_{0.2}Ti_{0.3}V_{0.5}$ | 200 | $(Al_{0.3}Ti_{0.6}V_{0.1})N$ | 1 | 80.9 |
| 6 | $Al_{0.6}Ti_{0.2}V_{0.2}$ | 15 | $(Al_{0.2}Ti_{0.3}V_{0.5})N$ | 8 | 80.0 |
| 7 | $Al_{0.8}Ti_{0.15}V_{0.05}$ | 200 | $(Al_{0.4}Ti_{0.25}V_{0.35})N$ | 5 | 61.5 |
| 8 | $Al_{0.4}Ti_{0.4}V_{0.2}$ | 600 | $(Al_{0.4}Ti_{0.25}V_{0.35})N$ | 10 | 55.0 |

TABLE 9-continued

| | First layer | | Second layer | | Critical |
|---|---|---|---|---|---|
| No | Composition | T.L. (nm) | Composition | T.L. ($\mu$m) | load (N) |
| 9 | $Al_{0.4}Ti_{0.4}V_{0.2}$ | 800 | $(Al_{0.4}Ti_{0.25}V_{0.35})N$ | 10 | 44.1 |
| 10 | $Al_{0.4}Ti_{0.4}V_{0.2}$ | 2 | $(Al_{0.4}Ti_{0.25}V_{0.35})N$ | 2 | 44.5 |
| 11 | $Al_{0.4}Ti_{0.4}V_{0.2}$ | 1 | $(Al_{0.4}Ti_{0.4}V_{0.2})(N_{0.6}C_{0.4})$ | 10 | 42.9 |
| 12 | $Al_{0.4}Ti_{0.4}V_{0.2}$ | 10 | $(Al_{0.4}Ti_{0.25}V_{0.35})N$ | 60 | 39.3 |
| 13 | None | — | $(Al_{0.6}Ti_{0.4})(N_{0.8}C_{0.2})$ | 5 | 60.3 |
| 14 | None | — | $(Al_{0.4}Ti_{0.25}V_{0.35})N$ | 3 | 35.2 |
| 15 | TiN | 1000 | $(Al_{0.4}Ti_{0.25}V_{0.35})N$ | 8 | 51.2 |

TABLE 10

| | First layer | | Intermediate layer | | Second layer | | | |
|---|---|---|---|---|---|---|---|---|
| No. | Composition | T.L.*1 ($\mu$m) | Composition | T.L. (nm) | Composition | T.L. ($\mu$m) | Wear (mm) | C.F. *4 |
| 1 | $(Al_{0.6}Ti_{0.4})N$ | 2 | None | — | $(Ti_{0.7}V_{0.3})N$ | 0.5 | 0.23 | 0.33 |
| 2 | $(Al_{0.6}Ti_{0.4})N$ | 5 | None | — | $(Ti_{0.7}V_{0.3})(N_{0.8}C_{0.2})$ | 2 | 0.25 | 0.34 |
| 3 | $(Al_{0.6}Ti_{0.4})(N_{0.8}C_{0.2})$ | 2.5 | None | — | $(Ti_{0.7}V_{0.3})N$ | 5 | 0.24 | 0.33 |
| 4 | $(Al_{0.6}Ti_{0.4})N$ | 5 | None | — | $(Ti_{0.6}V_{0.4})N$ | 5 | 0.19 | 0.31 |
| 5 | $(Al_{0.8}Ti_{0.4})N$ | 5 | None | — | $(Ti_{0.6}V_{0.4})(N_{0.6}C_{0.4})$ | 5 | 0.20 | 0.30 |
| 6 | $(Al_{0.6}Ti_{0.4})(N_{0.6}C_{0.4})$ | 5 | None | — | $(Ti_{0.6}V_{0.4})N$ | 5 | 0.20 | 0.32 |
| 7 | $(Al_{0.6}Ti_{0.4})N$ | 2 | None | — | $(Ti_{0.5}V_{0.5})N$ | 3 | 0.18 | 0.27 |
| 8 | $(Al_{0.6}Ti_{0.4})N$ | 5 | None | — | $(Ti_{0.5}V_{0.5})N$ | 15 | 0.20 | 0.28 |
| 9 | $(Al_{0.6}Ti_{0.4})N$ | 20 | None | — | $(Ti_{0.5}V_{0.5})N$ | 20 | 0.19 | 0.25 |
| 10 | $(Al_{0.6}Ti_{0.4})N$ | 5 | None | — | $(Ti_{0.4}V_{0.6})N$ | 3 | 0.19 | 0.24 |
| 11 | $(Al_{0.6}Ti_{0.4})N$ | 5 | None | — | $(Ti_{0.3}V_{0.7})N$ | 5 | 0.24 | 0.23 |
| 12 | $(Al_{0.3}Ti_{0.7})N$ | 1 | None | — | $(Ti_{0.5}V_{0.5})N$ | 3 | 0.20 | 0.29 |
| 13 | $(Al_{0.45}Ti_{0.55})N$ | 2 | None | — | $(Ti_{0.8}V_{0.5})N$ | 10 | 0.19 | 0.27 |
| 14 | $(Al_{0.7}Ti_{0.3})N$ | 3 | None | — | $(Ti_{0.5}V_{0.5})N$ | 5 | 0.20 | 0.29 |
| 15 | $(Al_{0.6}Ti_{0.4})N$ | 2 | None | — | $(Ti_{0.8}V_{0.2})N$ | 3 | 0.35 | 0.40 |
| 16 | $(Al_{0.6}Ti_{0.4})N$ | 2 | None | — | $(Ti_{0.2}V_{0.8})N$ | 3 | 0.37 | 0.28 |
| 17 | $(Al_{0.2}Ti_{0.8})N$ | 1 | None | — | $(Ti_{0.5}V_{0.5})N$ | 5 | —*5 | —*7 |
| 18 | $(Al_{0.8}Ti_{0.2})N$ | 1 | None | — | $(Ti_{0.5}V_{0.5})N$ | 5 | —*5 | —*7 |
| 19 | $(Al_{0.45}Ti_{0.55})N$ | 20 | None | — | $(Ti_{0.5}V_{0.5})N$ | 40 | —*6 | 0.29 |
| 20 | $(Al_{0.7}Ti_{0.3})N$ | 0.2 | None | — | $(Ti_{0.5}V_{0.5})N$ | 0.3 | 0.80 | 0.32 |
| 21 | $(Al_{0.6}Ti_{0.4})N$ | 2 | Ti | 50 | $(Ti_{0.5}V_{0.5})N$ | 2 | 0.17 | 0.27 |
| 22 | $(Al_{0.5}Ti_{0.5})N$ | 5 | Ta | 5 | $(Ti_{0.5}V_{0.5})N$ | 2 | 0.19 | 0.28 |
| 23 | $(Al_{0.6}Ti_{0.4})N$ | 10 | W | 500 | $(Ti_{0.4}V_{0.6})N$ | 10 | 0.18 | 0.25 |
| 24 | $(Al_{0.6}Ti_{0.4})N$ | 3 | $Ti_{0.5}V_{0.5}$ | 100 | $(Ti_{0.5}V_{0.5})N$ | 1 | 0.16 | 0.28 |
| 25 | $(Al_{0.6}Ti_{0.4})N$ | 5 | $Ti_{0.5}V_{0.4}$ | 20 | $(Ti_{0.4}V_{0.6})N$ | 5 | 0.17 | 0.24 |
| 26 | $(Al_{0.6}Ti_{0.4})N$ | 5 | Ti | 600 | $(Ti_{0.5}V_{0.5})N$ | 5 | 0.37 | 0.29 |
| 27 | None | — | None | — | $(Ti_{0.3}V_{0.7})N$ | 5 | —*5 | —*7 |
| 28 | TiN | 1 | None | — | $(Ti_{0.3}V_{0.7})N$ | 5 | —*5 | —*7 |
| 29 | $(Al_{0.5}Ti_{0.5})N$ | 5 | None | — | None | — | 0.62 | 0.51 |

*1: T.L. means "thickness of layer".
*4: C.F. means "Coefficient of friction".
*5: Hard coating was peeled off.
*6: Hard coating was damaged.
*7: Measurement could not be carried out.

TABLE 11

| | First Layer | | Second layer | | | |
|---|---|---|---|---|---|---|
| No | Composition | T.L. (nm) | Composition | T.L. ($\mu$m) | Wear (mm) | C.F. *4 |
| 1 | Ti | 50 | $(Ti_{0.5}V_{0.5})N$ | 5 | 0.19 | 0.30 |
| 2 | V | 150 | $(Ti_{0.6}V_{0.4})(N_{0.8}C_{0.2})$ | 2 | 0.21 | 0.31 |
| 3 | Ta | 500 | $(Ti_{0.4}V_{0.6})N$ | 10 | 0.20 | 0.29 |
| 4 | Cr | 5 | $(Ti_{0.5}V_{0.5})(N_{0.6}C_{0.4})$ | 1 | 0.18 | 0.31 |
| 5 | Mo | 300 | $(Ti_{0.6}V_{0.4})(N_{0.8}C_{0.2})$ | 20 | 0.21 | 0.32 |
| 6 | Zr | 100 | $(Ti_{0.4}V_{0.6})N$ | 15 | 0.20 | 0.29 |
| 7 | Ti | 100 | $(Ti_{0.7}V_{0.3})N$ | 5 | 0.23 | 0.33 |
| 8 | W | 50 | $(Ti_{0.2}V_{0.7})(N_{0.8}C_{0.2})$ | 10 | 0.24 | 0.29 |
| 9 | Ti | 30 | $(Ti_{0.8}V_{0.2})N$ | 5 | 0.35 | 0.41 |
| 10 | Ta | 200 | $(Ti_{0.2}V_{0.8})(N_{0.8}C_{0.2})$ | 8 | 0.37 | 0.28 |
| 11 | Cr | 150 | $(Ti_{0.5}V_{0.5})(N_{0.4}C_{0.6})$ | 10 | 0.35 | 0.32 |
| 12 | Ti | 600 | $(Ti_{0.6}V_{0.4})N$ | 5 | 0.61 | 0.32 |
| 13 | Zr | 2 | $(Ti_{0.4}V_{0.6})(N_{0.6}C_{0.4})$ | 15 | 0.51 | 0.30 |
| 14 | Ta | 50 | $(Ti_{0.5}V_{0.5})N$ | 25 | 0.78 | 0.31 |
| 15 | Cr | 100 | $(Ti_{0.6}V_{0.4})(N_{0.8}C_{0.2})$ | 0.5 | 0.73 | 0.33 |
| 16 | None | — | $(Ti_{0.3}V_{0.7})N$ | 5 | 0.55 | 0.30 |
| 17 | TiN | 1000 | $(Ti_{0.3}V_{0.7})N$ | 5 | 0.47 | 0.31 |
| 18 | None | — | $(Al_{0.5}Ti_{0.5})N$ | 5 | 0.62 | 0.51 |

*4: C.F. means "Coefficient of friction".

TABLE 12

| | First layer | | Second layer | | | |
|---|---|---|---|---|---|---|
| No | Composition | T.L. (nm) | Composition | T.L. ($\mu$m) | Wear (mm) | C.F. *4 |
| 1 | $Ti_{0.5}V_{0.5}$ | 50 | $(Ti_{0.5}V_{0.6})N$ | 5 | 0.18 | 0.30 |
| 2 | $Ti_{0.6}V_{0.4}$ | 150 | $(Ti_{0.4}V_{0.6})N$ | 10 | 0.19 | 0.31 |
| 3 | $Ti_{0.4}V_{0.6}$ | 500 | $(Ti_{0.4}V_{0.6})N$ | 15 | 0.20 | 0.29 |
| 4 | $Ti_{0.4}V_{0.6}$ | 5 | $(Ti_{0.6}V_{0.4})N$ | 1 | 0.22 | 0.32 |
| 5 | $Ti_{0.3}V_{0.7}$ | 50 | $(Ti_{0.5}V_{0.6})N$ | 5 | 0.22 | 0.29 |
| 6 | $Ti_{0.7}V_{0.3}$ | 200 | $(Ti_{0.5}V_{0.5})N$ | 10 | 0.23 | 0.31 |
| 7 | $Ti_{0.8}V_{0.2}$ | 100 | $(Ti_{0.5}V_{0.5})N$ | 20 | 0.24 | 0.29 |
| 8 | $Ti_{0.2}V_{0.8}$ | 300 | $(Ti_{0.5}V_{0.5})N$ | 5 | 0.23 | 0.30 |
| 9 | Ti | 20 | $(Ti_{0.6}V_{0.4})N$ | 8 | 0.25 | 0.31 |
| 10 | V | 50 | $(Ti_{0.4}V_{0.6})N$ | 5 | 0.24 | 0.29 |
| 11 | $Ti_{0.7}V_{0.3}$ | 500 | $(Ti_{0.7}V_{0.3})N$ | 10 | 0.26 | 0.32 |
| 12 | V | 150 | $(Ti_{0.7}V_{0.3})N$ | 3 | 0.27 | 0.32 |
| 13 | Ti | 100 | $(Ti_{0.3}V_{0.7})N$ | 5 | 0.26 | 0.29 |
| 14 | $Ti_{0.6}V_{0.4}$ | 50 | $(Ti_{0.8}V_{0.2})N$ | 5 | 0.36 | 0.40 |
| 15 | $Ti_{0.4}V_{0.6}$ | 10 | $(Ti_{0.2}V_{0.8})(N_{0.8}C_{0.2})$ | 8 | 0.39 | 0.29 |
| 16 | $Ti_{0.4}V_{0.6}$ | 150 | $(Ti_{0.5}V_{0.5})(N_{0.4}C_{0.6})$ | 10 | 0.34 | 0.32 |
| 17 | $Ti_{0.6}V_{0.4}$ | 600 | $(Ti_{0.5}V_{0.4})N$ | 5 | 0.62 | 0.33 |
| 18 | $Ti_{0.4}V_{0.6}$ | 2 | $(Ti_{0.4}V_{0.6})(N_{0.6}C_{0.4})$ | 15 | 0.50 | 0.32 |
| 19 | $Ti_{0.5}V_{0.4}$ | 50 | $(Ti_{0.5}V_{0.5})N$ | 25 | 0.79 | 0.32 |
| 20 | $Ti_{0.6}V_{0.4}$ | 100 | $(Ti_{0.6}V_{0.4})(N_{0.8}C_{0.2})$ | 0.5 | 0.74 | 0.34 |
| 21 | None | — | $(Ti_{0.3}V_{0.7})N$ | 5 | 0.55 | 0.30 |
| 22 | TiN | 1000 | $(Ti_{0.3}V_{0.7})N$ | 5 | 0.47 | 0.31 |
| 23 | None | — | $(Al_{0.5}Ti_{0.5})N$ | 5 | 0.62 | 0.51 |

*4: C.F. means "Coefficient of friction".

TABLE 14

| | First Layer | | Second layer | | | |
|---|---|---|---|---|---|---|
| No | Composition | T.L. (nm) | Composition | T.L. ($\mu$m) | Wear (mm) | C.F. *4 |
| 1 | Ti | 5 | $(Al_{0.4}Ti_{0.25}V_{0.36})N$ | 5 | 0.18 | 0.29 |
| 2 | Ti | 150 | $(Al_{0.4}Ti_{0.4}V_{0.2})(N_{0.6}C_{0.4})$ | 10 | 0.19 | 0.31 |
| 3 | Zr | 500 | $(Al_{0.6}Ti_{0.2}V_{0.2})N$ | 20 | 0.21 | 0.31 |
| 4 | Ta | 200 | $(Al_{0.3}Ti_{0.6}V_{0.1})N$ | 1 | 0.23 | 0.33 |
| 5 | W | 15 | $(Al_{0.2}Ti_{0.3}V_{0.5})N$ | 8 | 0.22 | 0.30 |
| 6 | Hf | 100 | $(Al_{0.5}Ti_{0.15}V_{0.35})N$ | 5 | 0.34 | 0.32 |
| 7 | Ta | 500 | $(Al_{0.8}Ti_{0.15}V_{0.05})N$ | 15 | 0.55 | 0.34 |
| 8 | Mo | 50 | $(Al_{0.15}Ti_{0.8}V_{0.05})N$ | 18 | 0.39 | 0.31 |
| 9 | Ti | 100 | $(Al_{0.4}Ti_{0.4}V_{0.2})(N_{0.4}C_{0.6})$ | 5 | 0.35 | 0.33 |
| 10 | Ti | 600 | $(Al_{0.4}Ti_{0.25}V_{0.35})N$ | 10 | 0.45 | 0.29 |
| 11 | Ta | 800 | $(Al_{0.4}Ti_{0.25}V_{0.35})N$ | 10 | 0.63 | 0.31 |
| 12 | Cr | 2 | $(Al_{0.4}Ti_{0.25}V_{0.35})N$ | 2 | 0.50 | 0.32 |
| 13 | W | 1 | $(Al_{0.4}Ti_{0.4}V_{0.2})(N_{0.6}C_{0.2})$ | 10 | 0.51 | 0.29 |
| 14 | Hf | 10 | $(Al_{0.4}Ti_{0.25}V_{0.35})N$ | 25 | 0.78 | 0.31 |
| 15 | Mo | 150 | $(Al_{0.4}Ti_{0.25}V_{0.35})N$ | 0.5 | 0.73 | 0.33 |
| 16 | None | — | $(Al_{0.5}Ti_{0.4})(N_{0.8}C_{0.2})$ | 5 | 0.48 | 0.58 |
| 17 | None | — | $(Al_{0.4}Ti_{0.25}V_{0.35})N$ | 3 | 0.55 | 0.35 |
| 18 | TiN | 1000 | $(Al_{0.4}Ti_{0.25}V_{0.35})N$ | 8 | 0.47 | 0.34 |

*4: C.F. means "Coefficient of friction".

TABLE 13

| | First layer | | Intermediate layer | | Second layer | | | |
|---|---|---|---|---|---|---|---|---|
| No | Composition | T.L. ($\mu$m) | Composition | T.L. (nm) | Composition | T.L. ($\mu$m) | Wear (mm) | C.F. *4 |
| 1 | $(Al_{0.6}Ti_{0.4})N$ | 5 | None | — | $(Al_{0.4}Ti_{0.25}V_{0.38})N$ | 5 | 0.17 | 0.29 |
| 2 | $(Al_{0.6}Ti_{0.4})(N_{0.6}C_{0.4})$ | 2 | None | — | $(Al_{0.4}Ti_{0.4}V_{0.2})(N_{0.8}C_{0.2})$ | 10 | 0.18 | 0.30 |
| 3 | $(Al_{0.5}Ti_{0.5})N$ | 10 | None | — | $(Al_{0.2}Ti_{0.3}V_{0.5})N$ | 35 | 0.19 | 0.28 |
| 4 | $(Al_{0.4}Ti_{0.6})N$ | 1 | None | — | $(Al_{0.6}Ti_{0.2}V_{0.2})N$ | 3 | 0.20 | 0.31 |
| 5 | $(Al_{0.7}Ti_{0.3})N$ | 0.5 | None | — | $(Al_{0.3}Ti_{0.6}V_{0.1})N$ | 0.5 | 0.19 | 0.32 |
| 6 | $(Al_{0.25}Ti_{0.75})(N_{0.8}C_{0.2})$ | 3 | None | — | $(Al_{0.2}Ti_{0.3}V_{0.5})N$ | 5 | 0.22 | 0.28 |
| 7 | $(Al_{0.75}Ti_{0.25})N$ | 10 | None | — | $(Al_{0.6}Ti_{0.2}V_{0.2})N$ | 20 | 0.22 | 0.31 |
| 8 | $(Al_{0.2}Ti_{0.8})N$ | 5 | None | — | $(Al_{0.4}Ti_{0.25}V_{0.35})N$ | 5 | 0.35 | 0.29 |
| 9 | $(Al_{0.8}Ti_{0.2})N$ | 10 | None | — | $(Al_{0.4}Ti_{0.4}V_{0.2})(N_{0.8}C_{0.2})$ | 10 | 0.40 | 0.30 |
| 10 | $(Al_{0.5}Ti_{0.5})(N_{0.4}C_{0.6})$ | 10 | None | — | $(Al_{0.2}Ti_{0.3}V_{0.5})N$ | 20 | 0.38 | 0.28 |
| 11 | $(Al_{0.6}Ti_{0.4})(N_{0.6}C_{0.4})$ | 5 | None | — | $(Al_{0.15}Ti_{0.8}V_{0.05})N_{0.8}C_{0.4})$ | 5 | 0.47 | 0.33 |
| 12 | $(Al_{0.5}Ti_{0.5})(N_{0.8}C_{0.2})$ | 2 | None | — | $(Al_{0.8}Ti_{0.15}V_{0.05})N_{0.8}C_{0.2})$ | 5 | 0.42 | 0.40 |
| 13 | $(Al_{0.4}Ti_{0.6})(N_{0.8}C_{0.2})$ | 4 | None | — | $(Al_{0.4}Ti_{0.4}V_{0.2})(N_{0.4}C_{0.6})$ | 10 | 0.40 | 0.32 |
| 14 | $(Al_{0.6}Ti_{0.4})N$ | 20 | None | — | $(Al_{0.4}Ti_{0.4}V_{0.2})N$ | 40 | 0.68 | 0.30 |
| 15 | $(Al_{0.5}Ti_{0.6})N$ | 0.2 | None | — | $(Al_{0.4}Ti_{0.4}V_{0.2})N$ | 0.3 | 0.75 | 0.31 |
| 16 | $(Al_{0.6}Ti_{0.4})N$ | 2 | Ti | 50 | $(Al_{0.}Ti_{0.25}V_{0.38})N$ | 2 | 0.17 | 0.29 |
| 17 | $(Al_{0.5}Ti_{0.5})N$ | 5 | Ta | 5 | $(Al_{0.}Ti_{0.4}V_{0.2})N$ | 2 | 0.16 | 0.30 |
| 18 | $(Al_{0.4}Ti_{0.6})N$ | 10 | W | 500 | $(Al_{0.}Ti_{0.4}V_{0.2})N$ | 10 | 0.18 | 0.29 |
| 19 | $(Al_{0.6}Ti_{0.4})N$ | 1 | $Al_{0.4}Ti_{0.25}V_{0.38}$ | 10 | $(Al_{0.4}Ti_{0.25}V_{0.35})N$ | 3 | 0.15 | 0.30 |
| 20 | $(Al_{0.5}Ti_{0.5})N$ | 3 | $Al_{0.5}Ti_{0.8}$ | 100 | $(Al_{0.}Ti_{0.4}V_{0.2})N$ | 1 | 0.16 | 0.31 |
| 21 | $(Al_{0.4}Ti_{0.6})N$ | 2 | $Al_{0.75}Ti_{0.2}V_{0.05}$ | 300 | $(Al_{0.}Ti_{0.4}V_{0.2})N$ | 5 | 0.17 | 0.29 |
| 22 | $(Al_{0.3}Ti_{0.7})(N_{0.8}C_{0.2})$ | 10 | $Al_{0.2}Ti_{0.75}V_{0.05}$ | 50 | $(Al_{0.2}Ti_{0.3}V_{0.5})N$ | 3 | 0.18 | 0.28 |
| 23 | $)Al_{0.7}Ti_{0.3})N$ | 5 | $Al_{0.25}Ti_{0.25}V_{0.4}$ | 20 | $(Al_{0.}Ti_{0.4}V_{0.2})N$ | 5 | 0.19 | 0.32 |
| 24 | $(Al_{0.4}Ti_{0.6})N$ | 10 | $Al_{0.9}Ti_{0.1}$ | 50 | $(Al_{0.3}Ti_{0.6}V_{0.1})N$ | 10 | 0.35 | 0.33 |
| 25 | $(Al_{0.5}Ti_{0.5})N$ | 5 | Ti | 600 | $(Al_{0.2}Ti_{0.3}V_{0.8})N$ | 5 | 0.37 | 0.29 |
| 26 | None | — | None | — | $(Al_{0.6}Ti_{0.4})(N_{0.8}C_{0.2})$ | 5 | 0.48 | 0.58 |
| 27 | None | — | None | — | $(Al_{0.4}Ti_{0.25}V_{0.35})N$ | 3 | 0.55 | 0.31 |
| 28 | TiN | 1 | None | — | $(Al_{0.4}Ti_{0.25}V_{0.35})N$ | 8 | 0.47 | 0.34 |

*4: C.F. means "Coefficient of friction".

TABLE 15

| No | First layer Composition | T.L. (nm) | Second layer Composition | T.L. (μm) | Wear (mm) | C.F. *4 |
|---|---|---|---|---|---|---|
| 1 | $Al_{0.4}Ti_{0.25}V_{0.35}$ | 5 | $(Al_{0.4}Ti_{0.25}V_{0.35})N$ | 5 | 0.17 | 0.28 |
| 2 | $Al_{0.4}Ti_{0.4}V_{0.2}$ | 50 | $(Al_{0.4}Ti_{0.25}V_{0.35})N$ | 10 | 0.19 | 0.29 |
| 3 | $Al_{0.4}Ti_{0.25}V_{0.35}$ | 150 | $(Al_{0.4}Ti_{0.4}V_{0.2})(N_{0.5}C_{0.4})$ | 20 | 0.18 | 0.30 |
| 4 | $Al_{0.3}Ti_{0.6}V_{0.1}$ | 500 | $(Al_{0.6}Ti_{0.2}V_{0.2})N$ | 15 | 0.20 | 0.30 |
| 5 | $Al_{0.2}Ti_{0.3}V_{0.5}$ | 200 | $(Al_{0.3}Ti_{0.6}V_{0.1})N$ | 1 | 0.22 | 0.32 |
| 6 | $Al_{0.5}Ti_{0.2}V_{0.2}$ | 15 | $(Al_{0.2}Ti_{0.3}V_{0.5})N$ | 8 | 0.21 | 0.29 |
| 7 | $Al_{0.4}Ti_{0.25}V_{0.35}$ | 100 | $(Al_{0.5}Ti_{0.15}V_{0.35})N$ | 5 | 0.33 | 0.31 |
| 8 | $Al_{0.4}Ti_{0.4}V_{0.2}$ | 500 | $(Al_{0.8}Ti_{0.15}V_{0.05})N$ | 30 | 0.55 | 0.33 |
| 9 | $Al_{0.4}Ti_{0.4}V_{0.2}$ | 50 | $(Al_{0.15}Ti_{0.8}V_{0.05})N$ | 40 | 0.38 | 0.30 |
| 10 | $Al_{0.8}Ti_{0.15}V_{0.05}$ | 200 | $(Al_{0.4}Ti_{0.25}V_{0.35})N$ | 5 | 0.38 | 0.29 |
| 11 | $Al_{0.4}Ti_{0.25}V_{0.35}$ | 100 | $(Al_{0.4}Ti_{0.4}V_{0.2})(N_{0.4}C_{0.6})$ | 5 | 0.35 | 0.33 |
| 12 | $Al_{0.4}Ti_{0.4}V_{0.2}$ | 600 | $(Al_{0.4}Ti_{0.25}V_{0.35})N$ | 10 | 0.45 | 0.28 |
| 13 | $Al_{0.4}Ti_{0.4}V_{0.2}$ | 800 | $(Al_{0.4}Ti_{0.25}V_{0.35})N$ | 10 | 0.62 | 0.30 |
| 14 | $Al_{0.4}Ti_{0.4}V_{0.2}$ | 2 | $(Al_{0.4}Ti_{0.25}V_{0.35})N$ | 2 | 0.50 | 0.31 |
| 15 | $Al_{0.4}Ti_{0.4}V_{0.2}$ | 1 | $(Al_{0.4}Ti_{0.4}V_{0.2})(N_{0.6}C_{0.4})$ | 10 | 0.50 | 0.32 |
| 16 | $Al_{0.4}Ti_{0.4}V_{0.2}$ | 10 | $(Al_{0.4}Ti_{0.25}V_{0.35})N$ | 60 | 0.77 | 0.30 |
| 17 | $Al_{0.4}Ti_{0.4}V_{0.2}$ | 150 | $(Al_{0.4}Ti_{0.25}V_{0.35})N$ | 0.5 | 0.72 | 0.32 |
| 18 | None | — | $(Al_{0.6}Ti_{0.4})(N_{0.8}C_{0.2})$ | 5 | 0.48 | 0.58 |
| 19 | None | — | $(Al_{0.4}Ti_{0.25}V_{0.35})N$ | 3 | 0.55 | 0.35 |
| 20 | TiN | 1000 | $(Al_{0.4}Ti_{0.25}V_{0.35})N$ | 8 | 0.47 | 0.34 |

*4: C.F. means "Coefficient of friction".

TABLE 16

| No. | First layer Composition | T.L.*1 (μm) | Intermediate layer Composition | T.L. (nm) | Second layer Composition | T.L. (μm) | Corner wear (mm) | Boundary wear (mm) |
|---|---|---|---|---|---|---|---|---|
| 1 | $(Al_{0.6}Ti_{0.4})N$ | 2 | None | — | $(Ti_{0.7}V_{0.3})N$ | 0.5 | 0.219 | 0.122 |
| 2 | $(Al_{0.6}Ti_{0.4})N$ | 0.5 | None | — | $(Ti_{0.6}V_{0.4})N$ | 0.5 | 0.214 | 0.119 |
| 3 | $(Al_{0.6}Ti_{0.4})N$ | 5 | None | — | $(Ti_{0.6}V_{0.4})(N_{0.6}C_{0.4})$ | 5 | 0.212 | 0.118 |
| 4 | $(Al_{0.6}Ti_{0.4})N$ | 2 | None | — | $(Ti_{0.5}V_{0.5})N$ | 3 | 0.191 | 0.108 |
| 5 | $(Al_{0.6}Ti_{0.4})N$ | 5 | None | — | $(Ti_{0.5}V_{0.5})N$ | 5 | 0.203 | 0.091 |
| 6 | $(Al_{0.6}Ti_{0.4})N$ | 5 | None | — | $(Ti_{0.5}V_{0.5})N$ | 10 | 0.198 | 0.110 |
| 7 | $(Al_{0.6}Ti_{0.4})N$ | 5 | None | — | $(Ti_{0.4}V_{0.6})N$ | 3 | 0.213 | 0.118 |
| 8 | $(Al_{0.6}Ti_{0.4})N$ | 5 | None | — | $(Ti_{0.3}V_{0.7})N$ | 5 | 0.220 | 0.125 |
| 9 | $(Al_{0.3}Ti_{0.7})N$ | 1 | None | — | $(Ti_{0.5}V_{0.6})N$ | 3 | 0.231 | 0.134 |
| 10 | $(Al_{0.45}Ti_{0.55})N$ | 2 | None | — | $(Ti_{0.5}V_{0.5})N$ | 10 | 0.221 | 0.128 |
| 11 | $(Al_{0.7}Ti_{0.3})N$ | 3 | None | — | $(Ti_{0.5}V_{0.5})N$ | 5 | 0.224 | 0.126 |
| 12 | $(Al_{0.6}Ti_{0.4})N$ | 2 | None | — | $(Ti_{0.8}V_{0.2})N$ | 3 | 0.308 | 0.298 |
| 13 | $(Al_{0.6}Ti_{0.4})N$ | 2 | None | — | $(Ti_{0.2}V_{0.8})N$ | 3 | 0.311 | 0.305 |
| 14 | $(Al_{0.2}Ti_{0.8})N$ | 1 | None | — | $(Ti_{0.5}V_{0.5})N$ | 5 | 0.325 | 0.318 |
| 15 | $(Al_{0.8}Ti_{0.2})N$ | 1 | None | — | $(Ti_{0.5}V_{0.5})N$ | 5 | 0.355 | 0.354 |
| 16 | $(Al_{0.45}Ti_{0.55})N$ | 5 | None | — | $(Ti_{0.5}V_{0.5})N$ | 20 | 0.603 | 0.504 |
| 17 | $(Al_{0.7}Ti_{0.3})N$ | 0.2 | None | — | $(Ti_{0.5}V_{0.5})N$ | 0.3 | 0.707 | 0.542 |
| 18 | $(Al_{0.6}Ti_{0.4})N$ | 2 | Ti | 50 | $(Ti_{0.5}V_{0.5})N$ | 2 | 0.188 | 0.090 |
| 19 | $(Al_{0.5}Ti_{0.5})N$ | 5 | Ta | 5 | $(Ti_{0.5}V_{0.5})N$ | 2 | 0.190 | 0.089 |
| 20 | $(Al_{0.5}Ti_{0.4})N$ | 10 | W | 500 | $(Ti_{0.4}V_{0.6})N$ | 10 | 0.188 | 0.092 |
| 21 | $(Al_{0.6}Ti_{0.4})N$ | 3 | $Ti_{0.5}V_{0.5}$ | 100 | $(Ti_{0.5}V_{0.5})N$ | 1 | 0.185 | 0.089 |
| 22 | $(Al_{0.6}Ti_{0.4})N$ | 5 | $Ti_{0.6}V_{0.4}$ | 20 | $(Ti_{0.4}V_{0.6})N$ | 5 | 0.186 | 0.091 |
| 23 | $(Al_{0.6}Ti_{0.4})N$ | 5 | Ti | 600 | $(Ti_{0.5}V_{0.5})N$ | 5 | 0.255 | 0.230 |
| 24 | None | — | None | — | $(Ti_{0.3}V_{0.1})N$ | 5 | 0.342 | 0.333 |
| 25 | TiN | 1 | None | — | $(Ti_{0.3}V_{0.7})N$ | 5 | 0.302 | 0.311 |
| 26 | $(Al_{0.5}Ti_{0.5})N$ | 5 | None | — | None | — | 0.382 | 0.402 |

*1: T.L. means "thickness of layer".

TABLE 17

| No | First layer Composition | First layer T.L. (nm) | Second layer Composition | Second layer T.L. (μm) | Corner wear (mm) | Boundary wear (mm) |
|---|---|---|---|---|---|---|
| 1 | Ti | 50 | $(Ti_{0.5}V_{0.5})N$ | 5 | 0.198 | 0.102 |
| 2 | V | 150 | $(Ti_{0.6}V_{0.4})(N_{0.8}C_{0.2})$ | 2 | 0.210 | 0.105 |
| 3 | Ta | 500 | $(Ti_{0.4}V_{0.6})N$ | 10 | 0.211 | 0.120 |
| 4 | CF | 5 | $(Ti_{0.5}V_{0.5})(N_{0.6}C_{0.4})$ | 1 | 0.201 | 0.108 |
| 5 | Mo | 300 | $(Ti_{0.6}V_{0.4})(N_{0.6}C_{0.2})$ | 20 | 0.215 | 0.122 |
| 6 | Zr | 100 | $(Ti_{0.3}V_{0.6})N$ | 15 | 0.217 | 0.112 |
| 7 | Ti | 100 | $(Ti_{0.7}V_{0.3})N$ | 5 | 0.229 | 0.142 |
| 8 | W | 50 | $(Ti_{0.3}V_{0.7})(N_{0.8}C_{0.2})$ | 10 | 0.231 | 0.135 |
| 9 | Ti | 30 | $(Ti_{0.8}V_{0.2})N$ | 5 | 0.308 | 0.298 |
| 10 | Ta | 200 | $(Ti_{0.2}V_{0.8})(N_{0.8}C_{0.2})$ | 8 | 0.313 | 0.305 |
| 11 | Cr | 150 | $(Ti_{0.5}V_{0.5})(N_{0.4}C_{0.6})$ | 10 | 0.330 | 0.333 |
| 12 | Ti | 600 | $(Ti_{0.6}V_{0.4})N$ | 5 | 0.362 | 0.324 |
| 13 | Zr | 2 | $(Ti_{0.4}V_{0.6})(N_{0.6}C_{0.4})$ | 15 | 0.339 | 0.320 |
| 14 | Ta | 50 | $(Ti_{0.5}V_{0.5})N$ | 25 | 0.604 | 0.653 |
| 15 | Cr | 100 | $(Ti_{0.5}V_{0.4})(N_{0.8}C_{0.2})$ | 0.5 | 0.707 | 0.744 |
| 16 | None | — | $(Ti_{0.3}V_{0.7})N$ | 5 | 0.342 | 0.333 |
| 17 | TiN | 1000 | $(Ti_{0.3}V_{0.7})N$ | 5 | 0.302 | 0.311 |
| 18 | None | — | $(Al_{0.5}Ti_{0.5})N$ | 5 | 0.382 | 0.402 |

TABLE 18

| No | First layer Composition | First layer T.L. (nm) | Second layer Composition | Second layer T.L. (μm) | Corner wear (mm) | Boundary wear (mm) |
|---|---|---|---|---|---|---|
| 1 | $Ti_{0.5}V_{0.5}$ | 50 | $(Ti_{0.5}V_{0.6})N$ | 5 | 0.197 | 0.101 |
| 2 | $Ti_{0.6}V_{0.4}$ | 150 | $(Ti_{0.6}V_{0.4})N$ | 10 | 0.205 | 0.105 |
| 3 | $Ti_{0.4}V_{0.6}$ | 500 | $(Ti_{0.4}V_{0.6})N$ | 15 | 0.201 | 0.108 |
| 4 | $Ti_{0.4}V_{0.6}$ | 5 | $(Ti_{0.6}V_{0.4})N$ | 1 | 0.211 | 0.112 |
| 5 | $Ti_{0.3}V_{0.7}$ | 50 | $(Ti_{0.4}V_{0.5})N$ | 5 | 0.218 | 0.118 |
| 6 | $Ti_{0.7}V_{0.3}$ | 200 | $(Ti_{0.5}V_{0.5})N$ | 10 | 0.215 | 0.115 |
| 7 | $Ti_{0.8}V_{0.2}$ | 100 | $(Ti_{0.5}V_{0.5})N$ | 20 | 0.220 | 0.123 |
| 8 | $Ti_{0.2}V_{0.8}$ | 300 | $(Ti_{0.5}V_{0.5})N$ | 5 | 0.218 | 0.120 |
| 9 | Ti | 20 | $(Ti_{0.6}V_{0.4})N$ | 8 | 0.222 | 0.125 |
| 10 | V | 50 | $(Ti_{0.4}V_{0.6})N$ | 5 | 0.219 | 0.130 |
| 11 | $Ti_{0.7}V_{0.3}$ | 500 | $(Ti_{0.7}V_{0.3})N$ | 10 | 0.232 | 0.142 |
| 12 | V | 150 | $(Ti_{0.7}V_{0.3})N$ | 3 | 0.229 | 0.139 |
| 13 | Ti | 100 | $(Ti_{0.3}V_{0.7})N$ | 5 | 0.231 | 0.145 |
| 14 | $Ti_{0.6}V_{0.4}$ | 50 | $(Ti_{0.8}V_{0.2})N$ | 5 | 0.302 | 0.295 |
| 15 | $Ti_{0.4}V_{0.6}$ | 10 | $(Ti_{0.2}V_{0.8})(N_{0.8}C_{0.2})$ | 8 | 0.316 | 0.302 |
| 16 | $Ti_{0.4}V_{0.6}$ | 150 | $(Ti_{0.5}V_{0.5})(N_{0.4}C_{0.6})$ | 10 | 0.332 | 0.331 |
| 17 | $Ti_{0.6}V_{0.4}$ | 600 | $(Ti_{0.6}V_{0.4})N$ | 5 | 0.360 | 0.319 |
| 18 | $Ti_{0.4}V_{0.6}$ | 2 | $(Ti_{0.4}V_{0.6})(N_{0.6}C_{0.4})$ | 15 | 0.337 | 0.318 |
| 19 | $Ti_{0.5}V_{0.6}$ | 50 | $(Ti_{0.5}V_{0.6})N$ | 25 | 0.601 | 0.649 |
| 20 | $Ti_{0.6}V_{0.4}$ | 100 | $(Ti_{0.6}V_{0.4})(N_{0.8}C_{0.2})$ | 0.5 | 0.705 | 0.741 |
| 21 | None | — | $(Ti_{0.3}V_{0.1})N$ | 5 | 0.342 | 0.333 |
| 22 | TiN | 1000 | $(Ti_{0.3}V_{0.7})N$ | 5 | 0.302 | 0.311 |
| 23 | None | — | $(Al_{0.5}Ti_{0.5})N$ | 5 | 0.382 | 0.402 |

TABLE 19

| No | First layer Composition | First layer T.L. (μm) | Intermediate layer Composition | Intermediate layer T.L. (nm) | Second layer Composition | Second layer T.L. (μm) | Corner wear (mm) | Boundary wear (mm) |
|---|---|---|---|---|---|---|---|---|
| 1 | $(Al_{0.6}Ti_{0.4})N$ | 5 | None | — | $(Al_{0.4}Ti_{0.25}V_{0.35})N$ | 5 | 0.192 | 0.103 |
| 2 | $(Al_{0.6}Ti_{0.4})(N_{0.6}C_{0.4})$ | 2 | None | — | $(Al_{0.4}Ti_{0.4}V_{0.2}(N_{0.8}C_{0.2})$ | 10 | 0.189 | 0.098 |
| 3 | $(Al_{0.5}Ti_{0.5})N$ | 5 | None | — | $(Al_{0.2}Ti_{0.3}V_{0.5})N$ | 15 | 0.195 | 0.110 |
| 4 | $(Al_{0.4}Ti_{0.6})N$ | 1 | None | — | $(Al_{0.6}Ti_{0.2}V_{0.2})N$ | 3 | 0.200 | 0.105 |
| 5 | $(Al_{0.7}Ti_{0.3})N$ | 0.5 | None | — | $(Al_{0.3}Ti_{0.6}V_{0.1})N$ | 0.5 | 0.205 | 0.112 |

TABLE 19-continued

| | First layer | | Intermediate layer | | Second layer | | Corner wear (mm) | Boundary wear (mm) |
|---|---|---|---|---|---|---|---|---|
| No | Composition | T.L. ($\mu$m) | Composition | T.L. (nm) | Composition | T.L. ($\mu$m) | | |
| 6 | $(Al_{0.25}Ti_{0.75})(N_{0.8}C_{0.2})$ | 3 | None | — | $(Al_{0.2}Ti_{0.3}V_{0.5})N$ | 5 | 0.215 | 0.120 |
| 7 | $(Al_{0.75}Ti_{0.25})N$ | 7 | None | — | $(Al_{0.6}Ti_{0.2}V_{0.2})N$ | 10 | 0.213 | 0.119 |
| 8 | $(Al_{0.2}Ti_{0.8})N$ | 5 | None | — | $(Al_{0.4}Ti_{0.25}V_{0.35})N$ | 5 | 0.320 | 0.230 |
| 9 | $(Al_{0.8}Ti_{0.2})N$ | 10 | None | — | $(Al_{0.4}Ti_{0.4}V_{0.2})(N_{0.8}C_{0.2})$ | 10 | 0.358 | 0.312 |
| 10 | $(Al_{0.2}Ti_{0.8})(N_{0.4}C_{0.6})$ | 5 | None | — | $(Al_{0.2}Ti_{0.3}V_{0.05})N$ | 10 | 0.298 | 0.252 |
| 11 | $(Al_{0.6}Ti_{0.4})(N_{0.4}C_{0.4})$ | 5 | None | — | $(Al_{0.15}Ti_{0.8}V_{0.05})(N_{0.4}C_{0.4})$ | 5 | 0.325 | 0.282 |
| 12 | $(Al_{0.5}Ti_{0.5})(N_{0.8}C_{0.2})$ | 2 | None | — | $(Al_{0.8}Ti_{0.15}V_{0.05})(N_{0.2}C_{0.2})$ | 5 | 0.319 | 0.303 |
| 13 | $(Al_{0.4}Ti_{0.6})(N_{0.8}C_{0.2})$ | 4 | None | — | $(Al_{0.4}Ti_{0.4}V_{0.2})(N_{0.4}C_{0.6})$ | 10 | 0.352 | 0.314 |
| 14 | $(Al_{0.6}Ti_{0.4})N$ | 10 | None | — | $(Al_{0.4}Ti_{0.4}V_{0.2})N$ | 15 | 0.782 | 0.692 |
| 15 | $(Al_{0.5}Ti_{0.5})N$ | 0.2 | None | — | $(Al_{0.4}Ti_{0.4}V_{0.2})N$ | 0.3 | 0.831 | 0.718 |
| 16 | $(Al_{0.6}Ti_{0.4})N$ | 2 | Ti | 50 | $(Al_{0.4}Ti_{0.25}V_{0.35})N$ | 2 | 0.189 | 0.098 |
| 17 | $(Al_{0.5}Ti_{0.5})N$ | 5 | Ta | 5 | $(Al_{0.4}Ti_{0.4}V_{0.2})N$ | 2 | 0.187 | 0.096 |
| 18 | $(Al_{0.4}Ti_{0.6})N$ | 10 | W | 500 | $(Al_{0.4}Ti_{0.4}V_{0.2})N$ | 10 | 0.188 | 0.096 |
| 19 | $(Al_{0.6}Ti_{0.4})N$ | 1 | $Al_{0.4}Ti_{0.25}V_{0.35}$ | 10 | $(Al_{0.4}Ti_{0.25}V_{0.35})N$ | 3 | 0.186 | 0.098 |
| 20 | $(Al_{0.5}Ti_{0.5})N$ | 3 | $Al_{0.5}Ti_{0.5}$ | 100 | $(Al_{0.4}Ti_{0.4}V_{0.2})N$ | 1 | 0.185 | 0.097 |
| 21 | $(Al_{0.4}Ti_{0.6})N$ | 2 | $Al_{0.75}Ti_{0.2}V_{0.05}$ | 300 | $(Al_{0.4}Ti_{0.4}V_{0.2})N$ | 5 | 0.187 | 0.096 |
| 22 | $(Al_{0.3}Ti_{0.7})(N_{0.8}C_{0.2})$ | 10 | $Al_{0.2}Ti_{0.75}V_{0.05}$ | 50 | $(Al_{0.2}Ti_{0.3}V_{0.5})N$ | 3 | 0.186 | 0.097 |
| 23 | $(Al_{0.7}Ti_{0.3})N$ | 5 | $Al_{0.25}Ti_{0.25}V_{0.5}$ | 20 | $(Al_{0.6}Ti_{0.2}V_{0.2})N$ | 5 | 0.188 | 0.097 |
| 24 | $(Al_{0.4}Ti_{0.6})N$ | 10 | $Al_{0.9}Ti_{0.1}$ | 50 | $(Al_{0.3}Ti_{0.6}V_{0.1})N$ | 10 | 0.237 | 0.215 |
| 25 | $(Al_{0.5}Ti_{0.5})N$ | 5 | Ti | 600 | $(Al_{0.2}Ti_{0.3}V_{0.6})N$ | 5 | 0.251 | 0.229 |
| 26 | None | — | None | — | $(Al_{0.6}Ti_{0.4})(N_{0.8}C_{0.2})$ | 5 | 0.488 | 0.319 |
| 27 | None | — | None | — | $(Al_{0.4}Ti_{0.25}V_{0.35})N$ | 3 | 0.441 | 0.352 |
| 28 | TiN | 1 | None | — | $(Al_{0.4}Ti_{0.25}V_{0.35})N$ | 8 | 0.420 | 0.318 |

TABLE 20

| | First layer | | Second layer | | Corner wear (mm) | Boundary wear (mm) |
|---|---|---|---|---|---|---|
| No | Composition | T.L. (nm) | Composition | T.L. ($\mu$m) | | |
| 1 | Ti | 5 | $(Al_{0.4}Ti_{0.25}V_{0.35})N$ | 5 | 0.193 | 0.099 |
| 2 | Ti | 150 | $(Al_{0.4}Ti_{0.4}V_{0.2})(N_{0.6}C_{0.4})$ | 10 | 0.195 | 0.092 |
| 3 | Zr | 500 | $(Al_{0.6}Ti_{0.2}V_{0.2})N$ | 20 | 0.210 | 0.112 |
| 4 | Ta | 200 | $(Al_{0.3}Ti_{0.6}V_{0.1})N$ | 1 | 0.208 | 0.117 |
| 5 | W | 15 | $(Al_{0.2}Ti_{0.3}V_{0.5})N$ | 8 | 0.215 | 0.108 |
| 6 | Hf | 100 | $(Al_{0.5}Ti_{0.15}V_{0.35})N$ | 5 | 0.343 | 0.224 |
| 7 | Ta | 500 | $(Al_{0.8}Ti_{0.15}V_{0.05})N$ | 15 | 0.429 | 0.321 |
| 8 | Mo | 50 | $(Al_{0.15}Ti_{0.8}V_{0.05})N$ | 18 | 0.419 | 0.317 |
| 9 | Ti | 100 | $(Al_{0.4}Ti_{0.4}V_{0.2})(N_{0.4}C_{0.6})$ | 5 | 0.352 | 0.333 |
| 10 | Ti | 600 | $(Al_{0.4}Ti_{0.25}V_{0.35})N$ | 10 | 0.419 | 0.297 |
| 11 | Ta | 800 | $(Al_{0.4}Ti_{0.25}V_{0.35})N$ | 10 | 0.450 | 0.324 |
| 12 | Cr | 2 | $(Al_{0.4}Ti_{0.25}V_{0.35})N$ | 2 | 0.422 | 0.320 |
| 13 | W | 1 | $(Al_{0.4}Ti_{0.4}V_{0.2})(N_{0.6}C_{0.4})$ | 10 | 0.431 | 0.329 |
| 14 | Hf | 10 | $(Al_{0.4}Ti_{0.25}V_{0.35})N$ | 25 | 0.780 | 0.652 |
| 15 | Mo | 150 | $(Al_{0.4}Ti_{0.25}V_{0.35})N$ | 0.5 | 0.853 | 0.732 |
| 16 | None | — | $(Al_{0.6}Ti_{0.4})(N_{0.8}C_{0.2})$ | 5 | 0.488 | 0.319 |
| 17 | None | — | $(Al_{0.4}Ti_{0.25}V_{0.35})N$ | 3 | 0.441 | 0.352 |
| 18 | TiN | 1000 | $(Al_{0.4}Ti_{0.25}V_{0.35})N$ | 8 | 0.420 | 0.318 |

*S: Chipping occured.

TABLE 21

| | First layer | | Second layer | | Corner wear (mm) | Boundary wear (mm) |
|---|---|---|---|---|---|---|
| No | Composition | T.L. (nm) | Composition | T.L. ($\mu$m) | | |
| 1 | $Al_{0.4}Ti_{0.25}V_{0.35}$ | 5 | $(Al_{0.4}Ti_{0.25}V_{0.35})N$ | 5 | 0.192 | 0.102 |
| 2 | $Al_{0.4}Ti_{0.4}V_{0.2}$ | 50 | $(Al_{0.4}Ti_{0.25}V_{0.35})N$ | 10 | 0.200 | 0.110 |
| 3 | $Al_{0.4}Ti_{0.25}V_{0.35}$ | 150 | $(Al_{0.4}Ti_{0.4}V_{0.2})(N_{0.6}C_{0.4})$ | 20 | 0.193 | 0.098 |
| 4 | $Al_{0.3}Ti_{0.6}V_{0.1}$ | 500 | $(Al_{0.6}Ti_{0.2}V_{0.2})N$ | 15 | 0.213 | 0.114 |
| 5 | $Al_{0.2}Ti_{0.3}V_{0.}$ | 200 | $(Al_{0.3}Ti_{0.6}V_{0.1})N$ | 1 | 0.213 | 0.112 |

TABLE 21-continued

| | First layer | | Second layer | | Corner | Boundary |
|---|---|---|---|---|---|---|
| No | Composition | T.L. (nm) | Composition | T.L. ($\mu$m) | wear (mm) | wear (mm) |
| 6 | $Al_{0.6}Ti_{0.2}V_{0.2}$ | 15 | $(Al_{0.2}Ti_{0.3}V_{0.5})N$ | 8 | 0.221 | 0.102 |
| 7 | $Al_{0.4}Ti_{0.25}V_{0.35}$ | 100 | $(Al_{0.5}Ti_{0.15}V_{0.35})N$ | 5 | 0.351 | 0.232 |
| 8 | $Al_{0.4}Ti_{0.4}V_{0.2}$ | 500 | $(Al_{0.8}Ti_{0.15}V_{0.05})N$ | 12 | 0.429 | 0.309 |
| 9 | $Al_{0.4}Ti_{0.4}V_{0.2}$ | 50 | $(Al_{0.15}Ti_{0.8}V_{0.05})N$ | 20 | 0.425 | 0.323 |
| 10 | $Al_{0.8}Ti_{0.15}V_{0.05}$ | 200 | $(Al_{0.4}Ti_{0.25}V_{0.35})N$ | 5 | 0.412 | 0.317 |
| 11 | $Al_{0.4}Ti_{0.25}V_{0.35}$ | 100 | $(Al_{0.4}Ti_{0.4}V_{0.2})(N_{0.4}C_{0.6})$ | 5 | 0.350 | 0.331 |
| 12 | $Al_{0.4}Ti_{0.4}V_{0.2}$ | 600 | $(Al_{0.4}Ti_{0.25}V_{0.35})N$ | 10 | 0.419 | 0.299 |
| 13 | $Al_{0.4}Ti_{0.4}V_{0.2}$ | 800 | $(Al_{0.4}Ti_{0.25}V_{0.35})N$ | 10 | 0.453 | 0.327 |
| 14 | $Al_{0.4}Ti_{0.4}V_{0.2}$ | 2 | $(Al_{0.4}Ti_{0.25}V_{0.35})N$ | 2 | 0.427 | 0.325 |
| 15 | $Al_{0.4}Ti_{0.4}V_{0.2}$ | 1 | $(Al_{0.4}Ti_{0.4}V_{0.2})(N_{0.6}C_{0.4})$ | 10 | 0.436 | 0.334 |
| 16 | $Al_{0.4}Ti_{0.4}V_{0.2}$ | 10 | $(Al_{0.4}Ti_{0.25}V_{0.35})N$ | 25 | 0.789 | 0.661 |
| 17 | $Al_{0.4}Ti_{0.4}V_{0.2}$ | 150 | $(Al_{0.4}Ti_{0.25}V_{0.35})N$ | 0.5 | 0.831 | 0.718 |
| 18 | None | — | $(Al_{0.6}Ti_{0.4})(N_{0.8}C_{0.2})$ | 5 | 0.488 | 0.319 |
| 19 | None | — | $(Al_{0.4}Ti_{0.25}V_{0.35})N$ | 3 | 0.441 | 0.352 |
| 20 | TiN | 1000 | $(Al_{0.4}Ti_{0.25}V_{0.35})N$ | 8 | 0.420 | 0.318 |

*S: Chipping occured.

TABLE 22

| | First layer | | Intermediate layer | | Second layer | | Corner | Boundary |
|---|---|---|---|---|---|---|---|---|
| No. | Composition | T.L.*1 ($\mu$m) | Composition | T.L. (nm) | Composition | T.L. ($\mu$m) | wear (mm) | wear (mm) |
| 1 | $(Al_{0.6}Ti_{0.4})N$ | 1 | None | — | $(Ti_{0.6}V_{0.6})N$ | 2 | 0.063 | 0.072 |
| 2 | $(Al_{0.4}Ti_{0.6})N$ | 1 | None | — | $(Ti_{0.6}V_{0.5})N$ | 2 | 0.073 | 0.079 |
| 3 | $(Al_{0.6}Ti_{0.4})N$ | 1 | Ti | 50 | $(Ti_{0.5}V_{0.5})N$ | 2 | 0.060 | 0.071 |
| 4 | $(Al_{0.6}Ti_{0.4})N$ | 1 | $Ti_{0.5}V_{0.5}$ | 100 | $(Ti_{0.5}V_{0.5})N$ | 2 | 0.057 | 0.069 |
| 5 | TiN | 1 | None | — | $(Ti_{0.6}V_{0.5})N$ | 2 | 0.113 | 0.358 |
| 6 | None | — | None | — | $(Ti_{0.6}V_{0.5})N$ | 3 | 0.126 | 0.403 |

*1: T.L. means "thickness of layer".

TABLE 23

| | First layer | | Second layer | | Corner | Boundary |
|---|---|---|---|---|---|---|
| No | Composition | T.L. ($\mu$m) | Composition | T.L. ($\mu$m) | wear (mm) | wear (mm) |
| 1 | $(Al_{0.5}Ti_{0.4})N$ | 1 | $(Al_{0.4}Ti_{0.25}V_{0.35})N$ | 2 | 0.062 | 0.071 |
| 2 | $(Al_{0.4}Ti_{0.6})N$ | 1 | $(Al_{0.4}Ti_{0.25}V_{0.35})N$ | 2 | 0.072 | 0.078 |
| 3 | TiN | 1 | $(Al_{0.4}Ti_{0.25}V_{0.35})N$ | 2 | 0.114 | 0.364 |
| 4 | None | — | $(Al_{0.4}Ti_{0.25}V_{0.35})N$ | 3 | 0.127 | 0.404 |

TABLE 24

| No. | First layer Composition | T.L.*1 (μm) | Intermediate layer Composition | T.L. (nm) | Second layer Composition | T.L. (μm) | Average number of holes |
|---|---|---|---|---|---|---|---|
| 1 | $(Al_{0.6}Ti_{0.4})N$ | 2 | None | — | $(Ti_{0.7}V_{0.3})N$ | 0.5 | 4,119 |
| 2 | $(Al_{0.6}Ti_{0.4})N$ | 0.5 | None | — | $(Ti_{0.6}V_{0.4})N$ | 0.5 | 4,219 |
| 3 | $(Al_{0.6}Ti_{0.4})N$ | 5 | None | — | $(Ti_{0.6}V_{0.4})(N_{0.6}C_{0.4})$ | 5 | 4,351 |
| 4 | $(Al_{0.6}Ti_{0.4})N$ | 2 | None | — | $(Ti_{0.6}V_{0.6})N$ | 3 | 4,503 |
| 5 | $(Al_{0.6}Ti_{0.4})N$ | 5 | None | — | $(Ti_{0.5}V_{0.6})N$ | 5 | 4,401 |
| 6 | $(Al_{0.6}Ti_{0.4})N$ | 5 | None | — | $(Ti_{0.5}V_{0.6})N$ | 10 | 4,653 |
| 7 | $(Al_{0.6}Ti_{0.4})N$ | 5 | None | — | $(Ti_{0.4}V_{0.6})N$ | 3 | 4,315 |
| 8 | $(Al_{0.6}Ti_{0.4})N$ | 5 | None | — | $(Ti_{0.3}V_{0.7})N$ | 5 | 4,198 |
| 9 | $(Al_{0.3}Ti_{0.7})N$ | 1 | None | — | $(Ti_{0.6}V_{0.6})N$ | 3 | 4,008 |
| 10 | $(Al_{0.45}Ti_{0.55})N$ | 2 | None | — | $(Ti_{0.6}V_{0.6})N$ | 10 | 4,183 |
| 11 | $(Al_{0.7}Ti_{0.3})N$ | 3 | None | — | $(Ti_{0.6}V_{0.6})N$ | 5 | 4,132 |
| 12 | $(Al_{0.6}Ti_{0.4})N$ | 2 | None | — | $(Ti_{0.6}V_{0.2})N$ | 3 | 2,518 |
| 13 | $(Al_{0.6}Ti_{0.4})N$ | 2 | None | — | $(Ti_{0.2}V_{0.8})N$ | 3 | 2,830 |
| 14 | $(Al_{0.2}Ti_{0.6})N$ | 1 | None | — | $(Ti_{0.6}V_{0.6})N$ | 5 | 2,672 |
| 15 | $(Al_{0.8}Ti_{0.2})N$ | 1 | None | — | $(Ti_{0.6}V_{0.6})N$ | 5 | 2,307 |
| 16 | $(Al_{0.45}Ti_{0.55})N$ | 5 | None | — | $(Ti_{0.6}V_{0.6})N$ | 20 | 1,813 |
| 17 | $(Al_{0.6}Ti_{0.4})N$ | 2 | Ti | 50 | $(Ti_{0.6}V_{0.6})N$ | 2 | 4,805 |
| 18 | $(Al_{0.6}Ti_{0.6})N$ | 5 | Ta | 5 | $(Ti_{0.6}V_{0.6})N$ | 2 | 4,779 |
| 19 | $(Al_{0.6}Ti_{0.4})N$ | 10 | W | 500 | $(Ti_{0.4}V_{0.6})N$ | 10 | 4,711 |
| 20 | $(Al_{0.6}Ti_{0.4})N$ | 3 | $Ti_{0.5}V_{0.5}$ | 100 | $(Ti_{0.6}V_{0.6})N$ | 1 | 4,975 |
| 21 | $(Al_{0.6}Ti_{0.4})N$ | 5 | $Ti_{0.6}V_{0.4}$ | 20 | $(Ti_{0.4}V_{0.6})N$ | 5 | 4,873 |
| 22 | $(Al_{0.6}Ti_{0.4})N$ | 5 | Ti | 600 | $(Ti_{0.6}V_{0.6})N$ | 5 | 3,453 |
| 23 | $(Al_{0.7}Ti_{0.3})N$ | 0.2 | None | — | $(Ti_{0.6}V_{0.6})N$ | 0.3 | 1,004 |
| 24 | None | — | None | — | $(Ti_{0.3}V_{0.7})N$ | 5 | 2,246 |
| 25 | TiN | 1 | None | — | $(Ti_{0.3}V_{0.7})N$ | 5 | 2,582 |
| 26 | $(Al_{0.8}Ti_{0.6})N$ | 5 | None | — | None | — | 2,520 |

*1: T.L. means "thickness of layer".

TABLE 25

| No | First layer Composition | T.L. (nm) | Second layer Composition | T.L. (μm) | Average number of holes |
|---|---|---|---|---|---|
| 1 | Ti | 50 | $(Ti_{0.5}V_{0.5})N$ | 5 | 4625 |
| 2 | V | 150 | $(Ti_{0.6}V_{0.4})(N_{0.8}C_{0.2})$ | 2 | 4352 |
| 3 | Ta | 500 | $(Ti_{0.4}V_{0.6})N$ | 10 | 4418 |
| 4 | Cr | 5 | $(Ti_{0.5}V_{0.5})(N_{0.6}C_{0.4})$ | 1 | 4532 |
| 5 | Mo | 300 | $(Ti_{0.6}V_{0.4})(N_{0.8}C_{0.2})$ | 20 | 4367 |
| 6 | Zr | 100 | $(Ti_{0.4}V_{0.6})N$ | 15 | 4395 |
| 7 | Ti | 100 | $(Ti_{0.7}V_{0.3})N$ | 5 | 4280 |
| 8 | W | 50 | $(Ti_{0.3}V_{0.7})(N_{0.8}C_{0.2})$ | 10 | 4195 |
| 9 | Ti | 30 | $(Ti_{0.8}V_{0.2})N$ | 5 | 3408 |
| 10 | Ta | 200 | $(Ti_{0.2}V_{0.8})(N_{0.8}C_{0.2})$ | 8 | 3326 |
| 11 | Cr | 150 | $(Ti_{0.5}V_{0.5})(N_{0.4}C_{0.6})$ | 10 | 3218 |
| 12 | Ti | 600 | $(Ti_{0.6}V_{0.4})N$ | 5 | 2518 |
| 13 | Zr | 2 | $(Ti_{0.4}V_{0.6})(N_{0.6}C_{0.4})$ | 15 | 2317 |
| 14 | Ta | 50 | $(Ti_{0.5}V_{0.5})N$ | 25 | 1813 |
| 15 | Cr | 100 | $(Ti_{0.6}V_{0.4})(N_{0.8}C_{0.2})$ | 0.5 | 1005 |
| 16 | None | — | $(Ti_{0.3}V_{0.7})N$ | 5 | 1798 |
| 17 | TiN | 1000 | $(Ti_{0.3}V_{0.7})N$ | 5 | 2582 |
| 18 | None | — | $(Al_{0.5}Ti_{0.5})N$ | 5 | 2520 |

TABLE 26

| No | First layer Composition | T.L. (nm) | Second layer Composition | T.L. (μm) | Average number of holes |
|---|---|---|---|---|---|
| 1 | $Ti_{0.5}V_{0.5}$ | 50 | $(Ti_{0.5}V_{0.5})N$ | 5 | 4631 |
| 2 | $Ti_{0.6}V_{0.4}$ | 150 | $(Ti_{0.5}V_{0.4})N$ | 10 | 4584 |
| 3 | $Ti_{0.4}V_{0.6}$ | 500 | $(Ti_{0.4}V_{0.6})N$ | 15 | 4567 |
| 4 | $Ti_{0.4}V_{0.6}$ | 5 | $(Ti_{0.6}V_{0.4})N$ | 1 | 4527 |
| 5 | $Ti_{0.3}V_{0.7}$ | 50 | $(Ti_{0.5}V_{0.5})N$ | 5 | 4482 |
| 6 | $Ti_{0.7}V_{0.3}$ | 200 | $(Ti_{0.5}V_{0.5})N$ | 10 | 4494 |
| 7 | $Ti_{0.8}V_{0.2}$ | 100 | $(Ti_{0.5}V_{0.5})N$ | 20 | 4413 |
| 8 | $Ti_{0.2}V_{0.8}$ | 300 | $(Ti_{0.5}V_{0.5})N$ | 5 | 4382 |
| 9 | Ti | 20 | $(Ti_{0.5}V_{0.4})N$ | 8 | 4318 |
| 10 | V | 50 | $(Ti_{0.4}V_{0.6})N$ | 5 | 4295 |
| 11 | $Ti_{0.7}V_{0.3}$ | 500 | $(Ti_{0.7}V_{0.3})N$ | 10 | 4310 |
| 12 | V | 150 | $(Ti_{0.7}V_{0.3})N$ | 3 | 4254 |
| 13 | Ti | 100 | $(Ti_{0.3}V_{0.7})N$ | 5 | 4199 |
| 14 | $Ti_{0.6}V_{0.4}$ | 50 | $(Ti_{0.8}V_{0.2})N$ | 5 | 3411 |
| 15 | $Ti_{0.4}V_{0.6}$ | 10 | $(Ti_{0.2}V_{0.8})(N_{0.8}C_{0.2})$ | 8 | 3342 |
| 16 | $Ti_{0.4}V_{0.6}$ | 150 | $(Ti_{0.5}V_{0.5})(N_{0.4}C_{0.6})$ | 10 | 3235 |
| 17 | $Ti_{0.6}V_{0.4}$ | 600 | $(Ti_{0.6}V_{0.4})N$ | 5 | 2521 |
| 18 | $Ti_{0.4}V_{0.6}$ | 2 | $(Ti_{0.4}V_{0.6})(N_{0.6}C_{0.4})$ | 15 | 2320 |
| 19 | $Ti_{0.6}V_{0.5}$ | 50 | $(Ti_{0.5}V_{0.5})N$ | 25 | 1816 |
| 20 | $Ti_{0.6}V_{0.4}$ | 100 | $(Ti_{0.6}V_{0.4})(N_{0.8}C_{0.2})$ | 0.5 | 1007 |
| 21 | None | — | $(Ti_{0.3}V_{0.7})N$ | 5 | 1798 |
| 22 | TiN | 1000 | $(Ti_{0.3}V_{0.7})N$ | 5 | 2582 |
| 23 | None | — | $(Ti_{0.5}V_{0.6})N$ | 5 | 2520 |

TABLE 27

| No | First layer Composition | T.L. (μm) | Intermediate layer Composition | T.L. (nm) | Second layer Composition | T.L. (μm) | Average number of holes |
|---|---|---|---|---|---|---|---|
| 1 | $(Al_{0.6}Ti_{0.4})N$ | 5 | None | — | $(Al_{0.4}Ti_{0.25}V_{0.35})N$ | 5 | 4710 |
| 2 | $(Al_{0.6}Ti_{0.4})(N_{0.6}C_{0.4})$ | 2 | None | — | $(Al_{0.4}Ti_{0.4}V_{0.2})(N_{0.8}C_{0.2})$ | 10 | 4750 |
| 3 | $(Al_{0.5}Ti_{0.5})N$ | 5 | None | — | $(Al_{0.2}Ti_{0.3}V_{0.5})N$ | 15 | 4618 |
| 4 | $(Al_{0.4}Ti_{0.6})N$ | 1 | None | — | $(Al_{0.6}Ti_{0.2}V_{0.2})N$ | 3 | 4513 |
| 5 | $(Al_{0.7}Ti_{0.3})N$ | 0.5 | None | — | $(Al_{0.3}Ti_{0.6}V_{0.1})N$ | 0.5 | 4498 |
| 6 | $(Al_{0.25}Ti_{0.75})(N_{0.8}C_{0.2})$ | 3 | None | — | $(Al_{0.2}Ti_{0.3}V_{0.5})N$ | 5 | 4325 |
| 7 | $(Al_{0.75}Ti_{0.25})N$ | 7 | None | — | $(Al_{0.6}Ti_{0.2}V_{0.2})N$ | 10 | 4218 |
| 8 | $(Al_{0.2}Ti_{0.8})N$ | 5 | None | — | $(Al_{0.4}Ti_{0.25}V_{0.35})N$ | 5 | 3054 |
| 9 | $(Al_{0.8}Ti_{0.2})N$ | 10 | None | — | $(Al_{0.4}Ti_{0.4}V_{0.2})(N_{0.8}C_{0.2})$ | 10 | 2621 |
| 10 | $(Al_{0.5}Ti_{0.5})N_{0.4}C_{0.5}$ | 5 | None | — | $(Al_{0.2}Ti_{0.3}V_{0.5})N$ | 10 | 2538 |
| 11 | $(Al_{0.6}Ti_{0.4})N_{0.6}C_{0.4}$ | 5 | None | — | $(Al_{0.15}Ti_{0.8}V_{0.05})(N_{0.6}C_{0.4})$ | 5 | 2481 |
| 12 | $(Al_{0.5}Ti_{0.5})N_{0.5}C_{0.2}$ | 2 | None | — | $(Al_{0.8}Ti_{0.15}V_{0.05})(N_{0.8}C_{0.2})$ | 5 | 2413 |
| 13 | $(Al_{0.4}Ti_{0.6})N_{0.8}C_{0.2}$ | 4 | None | — | $(Al_{0.4}Ti_{0.4}V_{0.2})(N_{0.4}C_{0.5})$ | 10 | 2847 |
| 14 | $(Al_{0.6}Ti_{0.4})N$ | 10 | None | — | $(Al_{0.4}Ti_{0.4}V_{0.2})N$ | 15 | 1512 |
| 15 | $(Al_{0.5}Ti_{0.5})N$ | 0.2 | None | — | $(Al_{0.4}Ti_{0.4}V_{0.2})N$ | 0.3 | 995 |
| 16 | $(Al_{0.6}Ti_{0.4})N$ | 2 | Ti | 50 | $(Al_{0.4}Ti_{0.25}V_{0.35})N$ | 2 | 4821 |
| 17 | $(Al_{0.5}Ti_{0.5})N$ | 5 | Ta | 5 | $(Al_{0.4}Ti_{0.4}V_{0.2})N$ | 2 | 4864 |
| 18 | $(Al_{0.4}Ti_{0.6})N$ | 10 | W | 500 | $(Al_{0.4}Ti_{0.4}V_{0.2})N$ | 10 | 4851 |
| 19 | $(Al_{0.6}Ti_{0.4})N$ | 1 | $Al_{0.4}Ti_{0.25}V_{0.35}$ | 10 | $(Al_{0.4}Ti_{0.25}V_{0.35})N$ | 3 | 4924 |
| 20 | $(Al_{0.5}Ti_{0.5})N$ | 3 | $Al_{0.5}Ti_{0.5}$ | 100 | $(Al_{0.4}Ti_{0.4}V_{0.2})N$ | 1 | 4908 |
| 21 | $(Al_{0.4}Ti_{0.6})N$ | 2 | $Al_{0.75}Ti_{0.2}V_{0.05}$ | 300 | $(Al_{0.4}Ti_{0.4}V_{0.2})N$ | 5 | 4897 |
| 22 | $(Al_{0.3}Ti_{0.7})(N_{0.8}C_{0.2})$ | 10 | $Al_{0.2}Ti_{0.5}V_{0.05}$ | 50 | $(Al_{0.2}Ti_{0.3}V_{0.5})N$ | 3 | 4853 |
| 23 | $(Al_{0.7}Ti_{0.3})N$ | 5 | $Al_{0.25}Ti_{0.25}V_{0.5}$ | 20 | $(Al_{0.6}Ti_{0.2}V_{0.2})N$ | 5 | 4831 |
| 24 | $(Al_{0.4}Ti_{0.5})N$ | 10 | $Al_{0.9}Ti_{0.1}$ | 50 | $(Al_{0.3}Ti_{0.6}V_{0.1})N$ | 10 | 3546 |
| 25 | $(Al_{0.5}Ti_{0.5})N$ | 5 | Ti | 600 | $(Al_{0.2}Ti_{0.3}V_{0.5})N$ | 5 | 3412 |
| 26 | None | — | None | — | $(Al_{0.6}Ti_{0.4})(N_{0.8}C_{0.2})$ | 5 | 2520 |
| 27 | None | — | None | — | $(Al_{0.4}Ti_{0.25}V_{0.35})N$ | 3 | 2213 |
| 28 | TiN | 1 | None | — | $(Al_{0.4}Ti_{0.25}V_{0.35})N$ | 8 | 2672 |

TABLE 28

| No | First layer Composition | T.L. (nm) | Second layer Composition | T.L. (μm) | Average number of holes |
|---|---|---|---|---|---|
| 1 | Ti | 5 | $(Al_{0.4}Ti_{0.25}V_{0.35})N$ | 5 | 4813 |
| 2 | Ti | 150 | $(Al_{0.4}Ti_{0.4}V_{0.2})(N_{0.6}C_{0.4})$ | 10 | 4921 |
| 3 | Zr | 500 | $(Al_{0.6}Ti_{0.2}V_{0.2})N$ | 20 | 4793 |
| 4 | Ta | 200 | $(Al_{0.3}Ti_{0.6}V_{0.1})N$ | 1 | 4873 |
| 5 | W | 15 | $(Al_{0.2}Ti_{0.3}V_{0.5})N$ | 8 | 4762 |
| 6 | Hf | 100 | $(Al_{0.5}Ti_{0.15}V_{0.35})N$ | 5 | 3510 |
| 7 | Ta | 500 | $(Al_{0.8}Ti_{0.15}V_{0.05})N$ | 15 | 2018 |
| 8 | Mo | 50 | $(Al_{0.15}Ti_{0.8}V_{0.05})N$ | 18 | 3007 |
| 9 | Ti | 100 | $(Al_{0.4}Ti_{0.4}V_{0.2})(N_{0.4}C_{0.6})$ | 5 | 3028 |
| 10 | Ti | 800 | $(Al_{0.4}Ti_{0.25}V_{0.35})N$ | 10 | 2579 |
| 11 | Ta | 800 | $(Al_{0.4}Ti_{0.25}V_{0.35})N$ | 10 | 2108 |
| 12 | Cr | 2 | $(Al_{0.4}Ti_{0.25}V_{0.35})N$ | 2 | 2253 |
| 13 | W | 1 | $(Al_{0.4}Ti_{0.4}V_{0.2})(N_{0.6}C_{0.4})$ | 10 | 2019 |
| 14 | Hf | 10 | $(Al_{0.4}Ti_{0.25}V_{0.35})N$ | 25 | 1532 |
| 15 | Mo | 150 | $(Al_{0.4}Ti_{0.25}V_{0.35})N$ | 0.5 | 1003 |
| 16 | None | — | $(Al_{0.6}Ti_{0.4})(N_{0.8}C_{0.2})$ | 5 | 2520 |
| 17 | None | — | $(Al_{0.4}Ti_{0.25}V_{0.35})N$ | 3 | 2213 |
| 18 | TiN | 1000 | $(Al_{0.4}Ti_{0.25}V_{0.35})N$ | 8 | 2672 |

TABLE 29

| No | First layer Composition | T.L. (nm) | Second layer Composition | T.L. (μm) | Average number of holes |
|---|---|---|---|---|---|
| 1 | $Al_{0.4}Ti_{0.25}V_{0.35}$ | 5 | $(Al_{0.4}Ti_{0.25}V_{0.35})N$ | 5 | 4826 |
| 2 | $Al_{0.4}Ti_{0.4}V_{0.2}$ | 50 | $(Al_{0.4}Ti_{0.25}V_{0.35})N$ | 10 | 4901 |
| 3 | $Al_{0.4}Ti_{0.25}V_{0.35}$ | 150 | $(Al_{0.4}Ti_{0.4}V_{0.2})(N_{0.6}C_{0.4})$ | 20 | 4942 |
| 4 | $Al_{0.3}Ti_{0.6}V_{0.1}$ | 500 | $(Al_{0.6}Ti_{0.2}V_{0.2})N$ | 15 | 4789 |
| 5 | $Al_{0.2}Ti_{0.3}V_{0.5}$ | 200 | $(Al_{0.3}Ti_{0.6}V_{0.1})N$ | 1 | 4880 |
| 6 | $Al_{0.6}Ti_{0.2}V_{0.2}$ | 15 | $(Al_{0.2}Ti_{0.3}V_{0.5})N$ | 8 | 4772 |
| 7 | $Al_{0.4}Ti_{0.25}V_{0.35}$ | 100 | $(Al_{0.5}Ti_{0.15}V_{0.35})N$ | 5 | 3508 |
| 8 | $Al_{0.4}Ti_{0.4}V_{0.2}$ | 500 | $(Al_{0.8}Ti_{0.15}V_{0.05})N$ | 12 | 2018 |
| 9 | $Al_{0.4}Ti_{0.4}V_{0.2}$ | 500 | $(Al_{0.15}Ti_{0.8}V_{0.05})N$ | 20 | 3013 |
| 10 | $Al_{0.8}Ti_{0.15}V_{0.05}$ | 200 | $(Al_{0.4}Ti_{0.25}V_{0.35})N$ | 5 | 2972 |
| 11 | $Al_{0.4}Ti_{0.25}V_{0.35}$ | 100 | $(Al_{0.4}Ti_{0.4}V_{0.2})(N_{0.4}C_{0.6})$ | 5 | 3019 |
| 12 | $Al_{0.4}Ti_{0.4}V_{0.2}$ | 600 | $(Al_{0.4}Ti_{0.25}V_{0.35})N$ | 10 | 2557 |
| 13 | $Al_{0.4}Ti_{0.4}V_{0.2}$ | 800 | $(Al_{0.4}Ti_{0.25}V_{0.35})N$ | 10 | 2092 |

TABLE 29-continued

| | First layer | | Second layer | | Average |
|---|---|---|---|---|---|
| No | Composition | T.L. (nm) | Composition | T.L. (μm) | number of holes |
| 14 | $Al_{0.4}Ti_{0.4}V_{0.2}$ | 2 | $(Al_{0.4}Ti_{0.25}V_{0.35})N$ | 2 | 2240 |
| 15 | $Al_{0.4}Ti_{0.4}V_{0.2}$ | 1 | $(Al_{0.4}Ti_{0.4}V_{0.2})(N_{0.6}C_{0.4})$ | 10 | 2004 |
| 16 | $Al_{0.4}Ti_{0.4}V_{0.2}$ | 10 | $(Al_{0.4}Ti_{0.25}V_{0.35})N$ | 25 | 1512 |
| 17 | $Al_{0.4}Ti_{0.4}V_{0.2}$ | 150 | $(Al_{0.4}Ti_{0.25}V_{0.35})N$ | 0.5 | 995 |
| 18 | None | — | $(Al_{0.6}Ti_{0.4})(N_{0.8}C_{0.2})$ | 5 | 2520 |
| 19 | None | — | $(Al_{0.4}Ti_{0.25}V_{0.35})N$ | 3 | 2213 |
| 20 | TiN | 1000 | $(Al_{0.4}Ti_{0.25}V_{0.36})N$ | 8 | 2672 |

TABLE 30

| | First layer | | Intermediate Layer | | Second layer | | Flank wear |
|---|---|---|---|---|---|---|---|
| No. | Composition | T.L.*1 (μm) | Composition | T.L. (nm) | Composition | T.L. (μm) | (mm) |
| 1 | $(Al_{0.6}Ti_{0.4})N$ | 2 | None | — | $(Ti_{0.7}V_{0.3})N$ | 0.5 | 0.104 |
| 2 | $(Al_{0.6}Ti_{0.4})N$ | 0.5 | None | — | $(Ti_{0.6}V_{0.4})N$ | 0.5 | 0.101 |
| 3 | $(Al_{0.6}Ti_{0.4})N$ | 5 | None | — | $(Ti_{0.6}V_{0.4})(N_{0.6}C_{0.4})$ | 5 | 0.096 |
| 4 | $(Al_{0.6}Ti_{0.4})N$ | 2 | None | — | $(Ti_{0.5}V_{0.5})N$ | 3 | 0.089 |
| 5 | $(Al_{0.6}Ti_{0.4})N$ | 5 | None | — | $(Ti_{0.5}V_{0.5})N$ | 5 | 0.085 |
| 6 | $(Al_{0.6}Ti_{0.4})N$ | 5 | None | — | $(Ti_{0.5}V_{0.5})N$ | 10 | 0.080 |
| 7 | $(Al_{0.6}Ti_{0.4})N$ | 5 | None | — | $(Ti_{0.4}V_{0.6})N$ | 3 | 0.087 |
| 8 | $(Al_{0.6}Ti_{0.4})N$ | 5 | None | — | $(Ti_{0.3}V_{0.7})N$ | 5 | 0.104 |
| 9 | $(Al_{0.3}Ti_{0.7})N$ | 1 | None | — | $(Ti_{0.5}V_{0.5})N$ | 3 | 0.118 |
| 10 | $(Al_{0.45}Ti_{0.55})N$ | 2 | None | — | $(Ti_{0.5}V_{0.5})N$ | 10 | 0.111 |
| 11 | $(Al_{0.7}Ti_{0.3})N$ | 3 | None | — | $(Ti_{0.5}V_{0.5})N$ | 5 | 0.120 |
| 12 | $(Al_{0.6}Ti_{0.4})N$ | 2 | None | — | $(Ti_{0.8}V_{0.2})N$ | 3 | 0.200 |
| 13 | $(Al_{0.6}Ti_{0.4})N$ | 2 | None | — | $(Ti_{0.2}V_{0.8})N$ | 3 | 0.205 |
| 14 | $(Al_{0.2}Ti_{0.8})N$ | 1 | None | — | $(Ti_{0.5}V_{0.5})N$ | 5 | 0.216 |
| 15 | $(Al_{0.8}Ti_{0.2})N$ | 1 | None | — | $(Ti_{0.5}V_{0.5})N$ | 5 | 0.232 |
| 16 | $(Al_{0.45}Ti_{0.55})N$ | 5 | None | — | $(Ti_{0.5}V_{0.5})N$ | 20 | 0.274 |
| 17 | $(Al_{0.5}Ti_{0.4})N$ | 2 | Ti | 50 | $(Ti_{0.5}V_{0.5})N$ | 2 | 0.074 |
| 18 | $(Al_{0.5}Ti_{0.5})N$ | 5 | Ta | 5 | $(Ti_{0.5}V_{0.5})N$ | 2 | 0.077 |
| 19 | $(Al_{0.6}Ti_{0.4})N$ | 10 | W | 500 | $(Ti_{0.4}V_{0.6})N$ | 10 | 0.079 |
| 20 | $(Al_{0.6}Ti_{0.4})N$ | 3 | $Ti_{0.5}V_{0.5}$ | 100 | $(Ti_{0.5}V_{0.5})N$ | 1 | 0.071 |
| 21 | $(Al_{0.5}Ti_{0.4})N$ | 5 | $Ti_{0.6}V_{0.4}$ | 20 | $(Ti_{0.4}V_{0.6})N$ | 5 | 0.073 |
| 22 | $(Al_{0.6}Ti_{0.4})N$ | 5 | Ti | 600 | $(Ti_{0.5}V_{0.5})N$ | 5 | 0.282 |
| 23 | $(Al_{0.7}Ti_{0.3})N$ | 0.2 | None | — | $(Ti_{0.5}V_{0.5})N$ | 0.3 | 0.350 |
| 24 | None | — | None | — | $(Ti_{0.3}V_{0.7})N$ | 5 | 0.326 |
| 25 | TiN | 1 | None | — | $(Ti_{0.3}V_{0.7})N$ | 5 | 0.289 |
| 26 | $(Al_{0.5}Ti_{0.5})N$ | 5 | None | — | None | — | 0.276 |

*1: T.L. means "thickness of layer".

TABLE 31

| | First layer | | Second layer | | Flank wear |
|---|---|---|---|---|---|
| No | Composition | T.L. (nm) | Composition | T.L. (μm) | (mm) |
| 1 | Ti | 50 | $(Ti_{0.6}V_{0.5})N$ | 5 | 0.080 |
| 2 | V | 150 | $(Ti_{0.6}V_{0.4})(N_{0.8}C_{0.2})$ | 2 | 0.087 |
| 3 | Ta | 500 | $(Ti_{0.4}V_{0.6})N$ | 10 | 0.095 |
| 4 | Cr | 5 | $(Ti_{0.5}V_{0.5})(N_{0.6}C_{0.4})$ | 1 | 0.084 |
| 5 | Mo | 300 | $(Ti_{0.6}V_{0.4})(N_{0.8}C_{0.2})$ | 20 | 0.091 |
| 6 | Zr | 100 | $(Ti_{0.4}V_{0.6})N$ | 15 | 0.091 |
| 7 | Ti | 100 | $(Ti_{0.7}V_{0.3})N$ | 5 | 0.113 |
| 8 | W | 50 | $(Ti_{0.3}V_{0.7})(N_{0.8}C_{0.2})$ | 10 | 0.120 |
| 9 | Ti | 30 | $(Ti_{0.8}V_{0.2})N$ | 5 | 0.200 |
| 10 | Ta | 200 | $(Ti_{0.2}V_{0.8})(N_{0.8}C_{0.2})$ | 8 | 0.211 |
| 11 | Cr | 150 | $(Ti_{0.5}V_{0.5})(N_{0.4}C_{0.6})$ | 10 | 0.237 |
| 12 | Ti | 600 | $(Ti_{0.6}V_{0.4})N$ | 5 | 0.268 |
| 13 | Zr | 2 | $(Ti_{0.4}V_{0.6})(N_{0.6}C_{0.4})$ | 15 | 0.305 |
| 14 | Ta | 50 | $(Ti_{0.5}V_{0.5})N$ | 25 | 0.284 |
| 15 | Cr | 100 | $(Ti_{0.6}V_{0.4})(N_{0.8}C_{0.2})$ | 0.5 | 0.350 |
| 16 | None | — | $(Ti_{0.3}V_{0.7})N$ | 5 | 0.326 |
| 17 | TiN | 1000 | $(Ti_{0.3}V_{0.7})N$ | 5 | 0.289 |
| 18 | None | — | $(Al_{0.5}Ti_{0.5})N$ | 5 | 0.276 |

TABLE 32

| No | First layer Composition | T.L. (nm) | Second layer Composition | T.L. (μm) | Flank wear (mm) |
|---|---|---|---|---|---|
| 1 | $Ti_{0.5}V_{0.5}$ | 50 | $(Ti_{0.5}V_{0.5})N$ | 5 | 0.080 |
| 2 | $Ti_{0.6}V_{0.4}$ | 150 | $(Ti_{0.6}V_{0.4})N$ | 10 | 0.084 |
| 3 | $Ti_{0.4}V_{0.6}$ | 500 | $(Ti_{0.4}V_{0.6})N$ | 15 | 0.084 |
| 4 | $Ti_{0.4}V_{0.6}$ | 5 | $(Ti_{0.6}V_{0.4})N$ | 1 | 0.087 |
| 5 | $Ti_{0.3}V_{0.7}$ | 50 | $(Ti_{0.5}V_{0.6})N$ | 5 | 0.095 |
| 6 | $Ti_{0.7}V_{0.3}$ | 200 | $(Ti_{0.5}V_{0.5})N$ | 10 | 0.091 |
| 7 | $Ti_{0.8}V_{0.2}$ | 100 | $(Ti_{0.5}V_{0.5})N$ | 20 | 0.102 |
| 8 | $Ti_{0.2}V_{0.6}$ | 300 | $(Ti_{0.5}V_{0.6})N$ | 5 | 0.098 |
| 9 | Ti | 20 | $(Ti_{0.6}V_{0.4})N$ | 8 | 0.109 |
| 10 | V | 50 | $(Ti_{0.4}V_{0.6})N$ | 5 | 0.113 |
| 11 | $Ti_{0.7}V_{0.3}$ | 500 | $(Ti_{0.7}V_{0.3})N$ | 10 | 0.109 |
| 12 | V | 150 | $(Ti_{0.7}V_{0.3})N$ | 3 | 0.116 |
| 13 | Ti | 100 | $(Ti_{0.3}V_{0.7})N$ | 5 | 0.120 |
| 14 | $Ti_{0.6}V_{0.4}$ | 50 | $(Ti_{0.8}V_{0.2})N$ | 5 | 0.200 |
| 15 | $Ti_{0.4}V_{0.6}$ | 10 | $(Ti_{0.2}V_{0.8})(N_{0.8}C_{0.2})$ | 8 | 0.210 |
| 16 | $Ti_{0.4}V_{0.6}$ | 150 | $(Ti_{0.5}V_{0.6})(N_{0.4}C_{0.6})$ | 10 | 0.236 |
| 17 | $Ti_{0.6}V_{0.4}$ | 600 | $(Ti_{0.6}V_{0.4})N$ | 5 | 0.266 |
| 18 | $Ti_{0.4}V_{0.6}$ | 2 | $(Ti_{0.4}V_{0.6})(N_{0.6}C_{0.4})$ | 15 | 0.304 |
| 19 | $Ti_{0.5}V_{0.5}$ | 50 | $(Ti_{0.5}V_{0.5})N$ | 25 | 0.281 |
| 20 | $Ti_{0.5}V_{0.4}$ | 100 | $(Ti_{0.6}V_{0.4})(N_{0.8}C_{0.2})$ | 0.5 | 0.350 |
| 21 | None | — | $(Ti_{0.3}V_{0.7})N$ | 5 | 0.326 |
| 22 | TiN | 1000 | $(Ti_{0.3}V_{0.7})N$ | 5 | 0.289 |
| 23 | None | — | $(Ti_{0.5}V_{0.5})N$ | 5 | 0.276 |

TABLE 34

| No | First layer Composition | T.L. (nm) | Second layer Composition | T.L. (μm) | Flank wear (mm) |
|---|---|---|---|---|---|
| 1 | Ti | 5 | $(Al_{0.4}Ti_{0.25}V_{0.35})N$ | 5 | 0.080 |
| 2 | Ti | 150 | $(Al_{0.4}Ti_{0.4}V_{0.2})(N_{0.6}C_{0.4})$ | 10 | 0.087 |
| 3 | Zr | 500 | $(Al_{0.6}Ti_{0.2}V_{0.2})N$ | 20 | 0.095 |
| 4 | Ta | 200 | $(Al_{0.3}Ti_{0.6}V_{0.1})N$ | 1 | 0.109 |
| 5 | W | 15 | $(Al_{0.2}Ti_{0.3}V_{0.5})N$ | 8 | 0.120 |
| 6 | Hf | 100 | $(Al_{0.5}Ti_{0.15}V_{0.35})N$ | 5 | 0.208 |
| 7 | Ta | 50 | $(Al_{0.8}Ti_{0.15}V_{0.05})N$ | 15 | 0.297 |
| 8 | Mo | 50 | $(Al_{0.15}Ti_{0.8}V_{0.05})N$ | 18 | 0.223 |
| 9 | Ti | 100 | $(Al_{0.4}Ti_{0.2}V_{0.2})(N_{0.4}C_{0.6})$ | 5 | 0.228 |
| 10 | Ti | 600 | $(Al_{0.4}Ti_{0.25}V_{0.35})N$ | 10 | 0.254 |
| 11 | Ta | 800 | $(Al_{0.4}Ti_{0.25}V_{0.35})N$ | 10 | 0.274 |
| 12 | Cr | 2 | $(Al_{0.4}Ti_{0.25}V_{0.35})N$ | 2 | 0.330 |
| 13 | W | 1 | $(Al_{0.4}Ti_{0.4}V_{0.2})(N_{0.6}C_{0.4})$ | 10 | 0.305 |
| 14 | Hf | 10 | $(Al_{0.4}Ti_{0.25}V_{0.35})N$ | 25 | 0.274 |
| 15 | Mo | 150 | $(Al_{0.4}Ti_{0.25}V_{0.35})N$ | 0.5 | 0.350 |
| 16 | None | — | $(Al_{0.6}Ti_{0.4})(N_{0.8}C_{0.2})$ | 5 | 0.280 |
| 17 | None | — | $(Al_{0.4}Ti_{0.25}V_{0.35})N$ | 3 | 0.331 |
| 18 | TiN | 1000 | $(Al_{0.4}Ti_{0.25}V_{0.35})N$ | 8 | 0.397 |

TABLE 33

| No | First layer Composition | T.L. (μm) | Intermediate layer Composition | T.L. (nm) | Second layer Composition | T.L. (μm) | Flank wear (mm) |
|---|---|---|---|---|---|---|---|
| 1 | $(Al_{0.6}Ti_{0.4})N$ | 5 | None | — | $(Al_{0.4}Ti_{0.25}V_{0.38})N$ | 5 | 0.091 |
| 2 | $(Al_{0.6}Ti_{0.4})(N_{0.6}C_{0.4})$ | 2 | None | — | $(Al_{0.4}Ti_{0.4}V_{0.2})(N_{0.8}C_{0.2})$ | 10 | 0.093 |
| 3 | $(Al_{0.5}Ti_{0.5})N$ | 5 | None | — | $(Al_{0.2}Ti_{0.3}V_{0.5})N$ | 15 | 0.099 |
| 4 | $(Al_{0.4}Ti_{0.6})N$ | 1 | None | — | $(Al_{0.6}Ti_{0.2}V_{0.2})N$ | 3 | 0.096 |
| 5 | $(Al_{0.7}Ti_{0.3})N$ | 0.5 | None | — | $(Al_{0.3}Ti_{0.6}V_{0.1})N$ | 0.5 | 0.101 |
| 6 | $(Al_{0.25}Ti_{0.75})(N_{0.8}C_{0.2})$ | 3 | None | — | $(Al_{0.2}Ti_{0.3}V_{0.5})N$ | 5 | 0.112 |
| 7 | $(Al_{0.75}Ti_{0.2}V_{0.2})N$ | 7 | None | — | $(Al_{0.25}Ti_{0.2}V_{0.2})N$ | 10 | 0.120 |
| 8 | $(Al_{0.2}Ti_{0.8})N$ | 5 | None | — | $(Al_{0.4}Ti_{0.25}V_{0.35})N$ | 5 | 0.200 |
| 9 | $(Al_{0.8}Ti_{0.2})N$ | 10 | None | — | $(Al_{0.3}Ti_{0.4}V_{0.2})(N_{0.8}C_{0.2})$ | 10 | 0.211 |
| 10 | $(Al_{0.5}Ti_{0.5})(N_{0.4}C_{0.6})$ | 5 | None | — | $(Al_{0.2}Ti_{0.3}V_{0.5})N$ | 10 | 0.216 |
| 11 | $(Al_{0.6}Ti_{0.4})(N_{0.6}C_{0.4})$ | 5 | None | — | $(Al_{0.15}Ti_{0.8}V_{0.05})N_{0.8}C_{0.4})$ | 5 | 0.230 |
| 12 | $(Al_{0.5}Ti_{0.8})(N_{0.8}C_{0.2})$ | 2 | None | — | $(Al_{0.4}Ti_{0.15}V_{0.05})(N_{0.8}C_{0.2})$ | 5 | 0.233 |
| 13 | $(Al_{0.4}Ti_{0.8})(N_{0.8}C_{0.2})$ | 4 | None | — | $(Al_{0.4}Ti_{0.}V_{0.2})(N_{0.4}C_{0.6})$ | 10 | 0.235 |
| 14 | $(Al_{0.6}Ti_{0.4})N$ | 10 | None | — | $(Al_{0.4}Ti_{0.}V_{0.2})N$ | 15 | 0.293 |
| 15 | $(Al_{0.5}Ti_{0.5})N$ | 0.2 | None | — | $(Al_{0.4}Ti_{0.}V_{0.2})N$ | 0.3 | 0.350 |
| 16 | $(Al_{0.6}Ti_{0.4})N$ | 2 | Ti | 50 | $(Al_{0.4}Ti_{0.25}V_{0.35})N$ | 2 | 0.083 |
| 17 | $(Al_{0.5}Ti_{0.5})N$ | 5 | Ta | 5 | $(Al_{0.4}Ti_{0.4}V_{0.2})N$ | 2 | 0.085 |
| 18 | $(Al_{0.4}Ti_{0.6})N$ | 10 | W | 500 | $(Al_{0.4}Ti_{0.4}V_{0.2})N$ | 10 | 0.083 |
| 19 | $(Al_{0.6}Ti_{0.4})N$ | 1 | $Al_{0.4}Ti_{0.25}V_{0.35}$ | 10 | $(Al_{0.4}Ti_{0.25}V_{0.35})N$ | 3 | 0.080 |
| 20 | $(Al_{0.5}Ti_{0.5})N$ | 3 | $Al_{0.5}Ti_{0.5}$ | 100 | $(Al_{0.4}Ti_{0.4}V_{0.2})N$ | 1 | 0.088 |
| 21 | $(Al_{0.4}Ti_{0.6})N$ | 2 | $Al_{0.75}Ti_{0.2}V_{0.05}$ | 300 | $(Al_{0.4}Ti_{0.4}V_{0.2})N$ | 5 | 0.085 |
| 22 | $(Al_{0.3}Ti_{0.7})(N_{0.8}C_{0.2})$ | 10 | $Al_{0.2}Ti_{0.75}V_{0.05}$ | 50 | $(Al_{0.2}Ti_{0.3}V_{0.5})N$ | 3 | 0.088 |
| 23 | $(Al_{0.7}Ti_{0.3})N$ | 5 | $Al_{0.25}Ti_{0.25}V_{0.5}$ | 20 | $(Al_{0.6}Ti_{0.2}V_{0.2})N$ | 5 | 0.083 |
| 24 | $(Al_{0.3}Ti_{0.6})N$ | 10 | $Al_{0.9}Ti_{0.1}$ | 50 | $(Al_{0.3}Ti_{0.6}V_{0.1})N$ | 10 | 0.274 |
| 25 | $(Al_{0.5}Ti_{0.5})N$ | 5 | Ti | 600 | $(Al_{0.2}Ti_{0.3}V_{0.5})N$ | 5 | 0.282 |
| 26 | None | — | None | — | $(Al_{0.6}Ti_{0.4})(N_{0.8}C_{0.2})$ | 5 | 0.280 |
| 27 | None | — | None | — | $(Al_{0.4}Ti_{0.25}V_{0.35})N$ | 3 | 0.331 |
| 28 | TiN | 1 | None | — | $(Al_{0.4}Ti_{0.25}V_{0.35})N$ | 8 | 0.297 |

TABLE 35

| | First layer | | Second layer | | |
|---|---|---|---|---|---|
| No | Composition | T.L. (nm) | Composition | T.L. ($\mu$m) | Flank wear (mm) |
| 1 | $Al_{0.4}Ti_{0.25}V_{0.35}$ | 5 | $(Al_{0.4}Ti_{0.25}V_{0.35})N$ | 5 | 0.080 |
| 2 | $Al_{0.4}Ti_{0.4}V_{0.2}$ | 50 | $(Al_{0.4}Ti_{0.25}V_{0.35})N$ | 10 | 0.084 |
| 3 | $Al_{0.4}Ti_{0.25}V_{0.35}$ | 150 | $(Al_{0.4}Ti_{0.4}V_{0.2})(N_{0.6}C_{0.4})$ | 20 | 0.087 |
| 4 | $Al_{0.3}Ti_{0.6}V_{0.1}$ | 500 | $(Al_{0.6}Ti_{0.2}V_{0.2})N$ | 15 | 0.095 |
| 5 | $Al_{0.2}Ti_{0.3}V_{0.5}$ | 200 | $(Al_{0.3}Ti_{0.6}V_{0.1})N$ | 1 | 0.109 |
| 6 | $Al_{0.6}Ti_{0.2}V_{0.2}$ | 15 | $(Al_{0.2}Ti_{0.3}V_{0.5})N$ | 8 | 0.120 |
| 7 | $Al_{0.4}Ti_{0.25}V_{0.35}$ | 100 | $(Al_{0.5}Ti_{0.15}V_{0.35})N$ | 5 | 0.227 |
| 8 | $Al_{0.4}Ti_{0.4}V_{0.2}$ | 500 | $(Al_{0.8}Ti_{0.15}V_{0.05})N$ | 12 | 0.297 |
| 9 | $Al_{0.4}Ti_{0.4}V_{0.2}$ | 50 | $(Al_{0.5}Ti_{0.8}V_{0.05})N$ | 20 | 0.244 |
| 10 | $Al_{0.8}Ti_{0.15}V_{0.05}$ | 200 | $(Al_{0.15}Ti_{0.25}V_{0.35})N$ | 5 | 0.200 |
| 11 | $Al_{0.4}Ti_{0.25}V_{0.35}$ | 100 | $(Al_{0.4}Ti_{0.4}V_{0.2})(N_{0.4}C_{0.6})$ | 5 | 0.246 |
| 12 | $Al_{0.4}Ti_{0.4}V_{0.2}$ | 800 | $(Al_{0.4}Ti_{0.25}V_{0.35})N$ | 10 | 0.273 |
| 13 | $Al_{0.4}Ti_{0.4}V_{0.2}$ | 800 | $(Al_{0.4}Ti_{0.25}V_{0.35})N$ | 10 | 0.285 |
| 14 | $Al_{0.4}Ti_{0.4}V_{0.2}$ | 2 | $(Al_{0.4}Ti_{0.25}V_{0.35})N$ | 2 | 0.319 |
| 15 | $Al_{0.4}Ti_{0.4}V_{0.2}$ | 1 | $(Al_{0.4}Ti_{0.4}V_{0.2})(N_{0.6}C_{0.4})$ | 10 | 0.328 |
| 16 | $Al_{0.4}Ti_{0.4}V_{0.2}$ | 10 | $(Al_{0.4}Ti_{0.25}V_{0.35})N$ | 25 | 0.290 |
| 17 | $Al_{0.4}Ti_{0.4}V_{0.2}$ | 150 | $(Al_{0.6}Ti_{0.25}V_{0.35})N$ | 0.5 | 0.350 |
| 18 | None | — | $(Al_{0.4}Ti_{0.4})(N_{0.8}C_{0.2})$ | 5 | 0.280 |
| 19 | None | — | $(Al_{0.4}Ti_{0.25}V_{0.35})N$ | 3 | 0.331 |
| 20 | TiN | 1000 | $(Al_{0.4}Ti_{0.25}V_{0.35})N$ | 8 | 0.297 |

TABLE 36

| | First layer | | Intermediate layer | | Second layer | | |
|---|---|---|---|---|---|---|---|
| No. | Composition | T.L.*1 ($\mu$m) | Composition | T.L. (nm) | Composition | T.L. ($\mu$m) | Flank wear (mm) |
| 1 | $(Al_{0.6}Ti_{0.4})N$ | 2 | None | — | $(Ti_{0.7}V_{0.3})N$ | 0.5 | 0.15 |
| 2 | $(Al_{0.6}Ti_{0.4})N$ | 0.5 | None | — | $(Ti_{0.6}V_{0.4})N$ | 0.5 | 0.13 |
| 3 | $(Al_{0.6}Ti_{0.4})N$ | 5 | None | — | $(Ti_{0.6}V_{0.4})(N_{0.6}C_{0.4})$ | 5 | 0.11 |
| 4 | $(Al_{0.6}Ti_{0.4})N$ | 2 | None | — | $(Ti_{0.5}V_{0.5})N$ | 3 | 0.09 |
| 5 | $(Al_{0.6}Ti_{0.4})N$ | 5 | None | — | $(Ti_{0.5}V_{0.6})N$ | 5 | 0.08 |
| 6 | $(Al_{0.6}Ti_{0.4})N$ | 5 | None | — | $(Ti_{0.5}V_{0.5})N$ | 10 | 0.06 |
| 7 | $(Al_{0.6}Ti_{0.4})N$ | 5 | None | — | $(Ti_{0.4}V_{0.6})N$ | 3 | 0.12 |
| 8 | $(Al_{0.6}Ti_{0.4})N$ | 5 | None | — | $(Ti_{0.3}V_{0.7})N$ | 5 | 0.15 |
| 9 | $(Al_{0.3}Ti_{0.7})N$ | 1 | None | — | $(Ti_{0.6}V_{0.6})N$ | 3 | 0.18 |
| 10 | $(Al_{0.45}Ti_{0.55})N$ | 2 | None | — | $(Ti_{0.5}V_{0.5})N$ | 10 | 0.17 |
| 11 | $(Al_{0.7}Ti_{0.3})N$ | 3 | None | — | $(Ti_{0.5}V_{0.5})N$ | 5 | 0.20 |
| 12 | $(Al_{0.6}Ti_{0.4})N$ | 2 | None | — | $(Ti_{0.6}V_{0.2})N$ | 3 | 0.48 |
| 13 | $(Al_{0.6}Ti_{0.4})N$ | 2 | None | — | $(Ti_{0.2}V_{0.8})N$ | 3 | 0.51 |
| 14 | $(Al_{0.2}Ti_{0.8})N$ | 1 | None | — | $(Ti_{0.5}V_{0.5})N$ | 5 | 0.58 |
| 15 | $(Al_{0.8}Ti_{0.2})N$ | 1 | None | — | $(Ti_{0.6}V_{0.6})N$ | 5 | 0.69 |
| 16 | $(Al_{0.45}Ti_{0.55})N$ | 5 | None | — | $(Ti_{0.5}V_{0.5})N$ | 20 | 0.62 |
| 17 | $(Al_{0.6}Ti_{0.4})N$ | 2 | Ti | 50 | $(Ti_{0.6}V_{0.6})N$ | 2 | 0.05 |
| 18 | $(Al_{0.5}Ti_{0.6})N$ | 5 | Ta | 5 | $(Ti_{0.6}V_{0.6})N$ | 2 | 0.06 |
| 19 | $(Al_{0.6}Ti_{0.4})N$ | 10 | W | 500 | $(Ti_{0.4}V_{0.6})N$ | 10 | 0.06 |
| 20 | $(Al_{0.6}Ti_{0.4})N$ | 3 | $Ti_{0.6}V_{0.5}$ | 100 | $(Ti_{0.6}V_{0.5})N$ | 1 | 0.05 |
| 21 | $(Al_{0.6}Ti_{0.4})N$ | 5 | $Ti_{0.6}V_{0.4}$ | 20 | $(Ti_{0.4}V_{0.6})N$ | 5 | 0.06 |
| 22 | $(Al_{0.6}Ti_{0.4})N$ | 5 | Ti | 600 | $(Ti_{0.6}V_{0.5})N$ | 5 | 0.58 |
| 23 | $(Al_{0.7}Ti_{0.3})N$ | 0.2 | None | — | $(Ti_{0.5}V_{0.5})N$ | 0.3 | 0.84 |
| 24 | None | — | None | — | $(Ti_{0.3}V_{0.7})N$ | 5 | 0.79 |
| 25 | TiN | 1 | None | — | $(Ti_{0.3}V_{0.7})N$ | 5 | 0.60 |
| 26 | $(Al_{0.5}Ti_{0.5})N$ | 5 | None | — | None | — | 0.57 |

*1: T.L. means "thickness of layer."

TABLE 37

| No | First layer Composition | First layer T.L. (nm) | Second layer Composition | Second layer T.L. (μm) | Flank wear (mm) |
|---|---|---|---|---|---|
| 1 | Ti | 50 | $(Ti_{0.5}V_{0.5})N$ | 5 | 0.06 |
| 2 | V | 150 | $(Ti_{0.6}V_{0.4})(N_{0.8}C_{0.2})$ | 2 | 0.08 |
| 3 | Ta | 500 | $(Ti_{0.4}V_{0.6})N$ | 10 | 0.09 |
| 4 | Cr | 5 | $(Ti_{0.5}V_{0.5})(N_{0.6}C_{0.4})$ | 1 | 0.07 |
| 5 | Mo | 300 | $(Ti_{0.6}V_{0.4})(N_{0.8}C_{0.2})$ | 20 | 0.9 |
| 6 | Zr | 100 | $(Ti_{0.4}V_{0.6})N$ | 15 | 0.10 |
| 7 | Ti | 100 | $(Ti_{0.7}V_{0.3})N$ | 5 | 0.15 |
| 8 | W | 50 | $(Ti_{0.3}V_{0.7})(N_{0.8}C_{0.2})$ | 10 | 0.18 |
| 9 | Ti | 30 | $(Ti_{0.8}V_{0.2})N$ | 5 | 0.48 |
| 10 | Ta | 200 | $(Ti_{0.2}V_{0.8})(N_{0.8}C_{0.2})$ | 8 | 0.51 |
| 11 | Cr | 150 | $(Ti_{0.5}V_{0.6})(N_{0.4}C_{0.6})$ | 10 | 0.44 |
| 12 | Ti | 600 | $(Ti_{0.6}V_{0.4})N$ | 5 | 0.59 |
| 13 | Zr | 2 | $(Ti_{0.4}V_{0.6})(N_{0.6}C_{0.4})$ | 15 | 0.75 |
| 14 | Ta | 50 | $(Ti_{0.5}V_{0.5})N$ | 25 | 0.65 |
| 15 | Cr | 100 | $(Ti_{0.6}V_{0.4})(N_{0.8}C_{0.2})$ | 0.5 | 0.83 |
| 16 | None | — | $(Ti_{0.3}V_{0.7})N$ | 5 | 0.79 |
| 17 | TiN | 1000 | $(Ti_{0.3}V_{0.7})N$ | 5 | 0.60 |
| 18 | None | — | $(Al_{0.5}Ti_{0.6})N$ | 5 | 0.57 |

TABLE 38

| No | First layer Composition | First layer T.L. (nm) | Second layer Composition | Second layer T.L. (μm) | Flank wear (mm) |
|---|---|---|---|---|---|
| 1 | $Ti_{0.5}V_{0.5}$ | 50 | $(Ti_{0.5}V_{0.5})N$ | 5 | 0.06 |
| 2 | $Ti_{0.5}V_{0.4}$ | 150 | $(Ti_{0.6}V_{0.4})N$ | 10 | 0.08 |
| 3 | $Ti_{0.6}V_{0.6}$ | 500 | $(Ti_{0.5}V_{0.6})N$ | 15 | 0.07 |
| 4 | $Ti_{0.6}V_{0.6}$ | 5 | $(Ti_{0.6}V_{0.4})N$ | 1 | 0.09 |
| 5 | $Ti_{0.3}V_{0.7}$ | 50 | $(Ti_{0.4}V_{0.5})N$ | 5 | 0.12 |
| 6 | $Ti_{0.7}V_{0.3}$ | 200 | $(Ti_{0.5}V_{0.5})N$ | 10 | 0.11 |
| 7 | $Ti_{0.8}V_{0.2}$ | 100 | $(Ti_{0.5}V_{0.6})N$ | 20 | 0.14 |
| 8 | $Ti_{0.2}V_{0.8}$ | 300 | $(Ti_{0.5}V_{0.5})N$ | 5 | 0.13 |
| 9 | Ti | 20 | $(Ti_{0.5}V_{0.4})N$ | 8 | 0.16 |
| 10 | V | 50 | $(Ti_{0.6}V_{0.6})N$ | 5 | 0.15 |
| 11 | $Ti_{0.7}V_{0.3}$ | 500 | $(Ti_{0.4}V_{0.3})N$ | 10 | 0.18 |
| 12 | V | 150 | $(Ti_{0.7}V_{0.3})N$ | 3 | 0.17 |
| 13 | Ti | 100 | $(Ti_{0.3}V_{0.7})N$ | 5 | 0.18 |
| 14 | $Ti_{0.6}V_{0.4}$ | 50 | $(Ti_{0.8}V_{0.2})N$ | 5 | 0.47 |
| 15 | $Ti_{0.4}V_{0.6}$ | 10 | $(Ti_{0.2}V_{0.8})(N_{0.8}C_{0.2})$ | 8 | 0.50 |
| 16 | $Ti_{0.4}V_{0.6}$ | 150 | $(Ti_{0.5}V_{0.5})(N_{0.5}C_{0.6})$ | 10 | 0.43 |
| 17 | $Ti_{0.4}V_{0.6}$ | 600 | $(Ti_{0.6}V_{0.4})N$ | 5 | 0.60 |
| 18 | $Ti_{0.4}V_{0.6}$ | 2 | $(Ti_{0.4}V_{0.6})(N_{0.6}C_{0.4})$ | 15 | 0.74 |
| 19 | $Ti_{0.5}V_{0.5}$ | 50 | $(Ti_{0.5}V_{0.5})N$ | 25 | 0.64 |
| 20 | $Ti_{0.6}V_{0.4}$ | 100 | $(Ti_{0.5}V_{0.4})(N_{0.8}C_{0.2})$ | 0.5 | 0.83 |
| 21 | None | — | $(Ti_{0.3}V_{0.7})N$ | 5 | 0.79 |
| 22 | TiN | 1000 | $(Ti_{0.3}V_{0.7})N$ | 5 | 0.60 |
| 23 | None | — | $(Ti_{0.5}V_{0.5})N$ | 5 | 0.57 |

TABLE 39

| No | First layer Composition | First layer T.L. (μm) | Intermediate layer Composition | Intermediate layer T.L. (nm) | Second layer Composition | Second layer T.L. (μm) | Flank wear (mm) |
|---|---|---|---|---|---|---|---|
| 1 | $(Al_{0.6}Ti_{0.4})N$ | 5 | None | — | $(Al_{0.4}Ti_{0.25}V_{0.35})N$ | 5 | 0.10 |
| 2 | $(Al_{0.6}Ti_{0.4})(N_{0.6}C_{0.4})$ | 2 | None | — | $(Al_{0.6}Ti_{0.4}V_{0.2})(N_{0.8}C_{0.2})$ | 10 | 0.11 |
| 3 | $(Al_{0.5}Ti_{0.5})N$ | 5 | None | — | $(Al_{0.2}Ti_{0.3}V_{0.5})N$ | 15 | 0.13 |
| 4 | $(Al_{0.4}Ti_{0.6})N$ | 1 | None | — | $(Al_{0.6}Ti_{0.2}V_{0.2})N$ | 3 | 0.14 |
| 5 | $(Al_{0.7}Ti_{0.3})N$ | 0.5 | None | — | $(Al_{0.3}Ti_{0.6}V_{0.1})N$ | 0.5 | 0.16 |
| 6 | $(Al_{0.25}Ti_{0.75})(N_{0.8}C_{0.2})$ | 3 | None | — | $(Al_{0.2}Ti_{0.3}V_{0.5})N$ | 5 | 0.18 |
| 7 | $(Al_{0.5}Ti_{0.25})N$ | 7 | None | — | $(Al_{0.6}Ti_{0.2}V_{0.2})N$ | 10 | 0.19 |
| 8 | $(Al_{0.2}Ti_{0.8})N$ | 5 | None | — | $(Al_{0.4}Ti_{0.25}V_{0.35})N$ | 5 | 0.42 |
| 9 | $(Al_{0.8}Ti_{0.2})N$ | 10 | None | — | $(Al_{0.4}Ti_{0.4}V_{0.2})(N_{0.8}C_{0.2})$ | 10 | 0.58 |
| 10 | $(Al_{0.5}Ti_{0.5})(N_{0.4}C_{0.6})$ | 5 | None | — | $(Al_{0.2}Ti_{0.3}V_{0.5})N$ | 5 | 0.63 |
| 11 | $(Al_{0.6}Ti_{0.4})(N_{0.6}C_{0.4})$ | 5 | None | — | $(Al_{0.15}Ti_{0.8}V_{0.05})(N_{0.6}C_{0.4})$ | 5 | 0.39 |
| 12 | $(Al_{0.5}Ti_{0.5})(N_{0.8}C_{0.2})$ | 2 | None | — | $(Al_{0.8}Ti_{0.15}V_{0.05})(N_{0.8}C_{0.2})$ | 5 | 0.51 |
| 13 | $(Al_{0.4}Ti_{0.6})(N_{0.8}C_{0.2})$ | 4 | None | — | $(Al_{0.4}Ti_{0.4}V_{0.2})(N_{0.4}C_{0.6})$ | 10 | 0.44 |
| 14 | $(Al_{0.6}Ti_{0.4})N$ | 10 | None | — | $(Al_{0.4}Ti_{0.4}V_{0.2})N$ | 15 | 0.72 |
| 15 | $(Al_{0.5}Ti_{0.5})N$ | 2 | None | — | $(Al_{0.4}Ti_{0.4}V_{0.2})N$ | 0.3 | 0.89 |
| 16 | $(Al_{0.6}Ti_{0.4})N$ | 2 | Ti | 50 | $(Al_{0.4}Ti_{0.25}V_{0.35})N$ | 2 | 0.09 |
| 17 | $(Al_{0.5}Ti_{0.5})N$ | 5 | Ta | 5 | $(Al_{0.4}Ti_{0.4}V_{0.2})N$ | 2 | 0.08 |
| 18 | $(Al_{0.4}Ti_{0.6})N$ | 10 | W | 500 | $(Al_{0.4}Ti_{0.4}V_{0.2})N$ | 10 | 0.10 |
| 19 | $(Al_{0.8}Ti_{0.4})N$ | 1 | $Al_{0.4}Ti_{0.25}V_{0.35}$ | 10 | $(Al_{0.4}Ti_{0.25}V_{0.35})N$ | 3 | 0.07 |
| 20 | $(Al_{0.5}Ti_{0.5})N$ | 3 | $Al_{0.5}Ti_{0.5}$ | 100 | $(Al_{0.4}Ti_{0.4}V_{0.2})N$ | 1 | 0.08 |
| 21 | $(Al_{0.4}Ti_{0.6})N$ | 2 | $Al_{0.75}Ti_{0.2}V_{0.05}$ | 300 | $(Al_{0.4}Ti_{0.3}V_{0.2})N$ | 5 | 0.09 |
| 22 | $(Al_{0.3}Ti_{0.7})(N_{0.8}C_{0.2})$ | 10 | $Al_{0.2}Ti_{0.75}V_{0.05}$ | 50 | $(Al_{0.2}Ti_{0.2}V_{0.5})N$ | 3 | 0.08 |
| 23 | $(Al_{0.5}Ti_{0.5})N$ | 10 | $Al_{0.9}Ti_{0.1}$ | 20 | $(Al_{0.3}Ti_{0.6}V_{0.1})N$ | 10 | 0.57 |
| 24 | $(Al_{0.5}Ti_{0.5})N$ | 5 | Ti | 600 | $(Al_{0.2}Ti_{0.3}V_{0.5})N$ | 5 | 0.58 |
| 25 | None | — | None | — | $(Al_{0.6}Ti_{0.4})(N_{0.8}C_{0.2})$ | 5 | 0.57 |
| 26 | None | — | None | — | $(Al_{0.4}Ti_{0.25}V_{0.35})N$ | 3 | 0.79 |
| 27 | TiN | 1 | None | — | $(Al_{0.4}Ti_{0.25}V_{0.35})N$ | 8 | 0.59 |

TABLE 40

| No | First layer Composition | First layer T.L. (nm) | Second layer Composition | Second layer T.L. (μm) | Flank wear (mm) |
|---|---|---|---|---|---|
| 1 | Ti | 5 | $(Al_{0.4}Ti_{0.25}V_{0.35})N$ | 5 | 0.07 |
| 2 | Ti | 150 | $(Al_{0.4}Ti_{0.4}V_{0.2})(N_{0.6}C_{0.4})$ | 10 | 0.06 |

TABLE 40-continued

| | First layer | | Second layer | | |
|---|---|---|---|---|---|
| No | Composition | T.L. (nm) | Composition | T.L. (μm) | Flank wear (mm) |
| 3 | Zr | 500 | $(Al_{0.6}Ti_{0.2}V_{0.2})N$ | 20 | 0.10 |
| 4 | Ta | 200 | $(Al_{0.3}Ti_{0.6}V_{0.1})N$ | 1 | 0.15 |
| 5 | W | 15 | $(Al_{0.2}Ti_{0.3}V_{0.5})N$ | 8 | 0.13 |
| 6 | Hf | 100 | $(Al_{0.5}Ti_{0.15}V_{0.35})N$ | 5 | 0.47 |
| 7 | Ta | 500 | $(Al_{0.8}Ti_{0.15}V_{0.05})N$ | 15 | 0.59 |
| 8 | Mo | 50 | $(Al_{0.15}Ti_{0.8}V_{0.05})N$ | 18 | 0.39 |
| 9 | Ti | 100 | $(Al_{0.4}Ti_{0.4}V_{0.2})(N_{0.4}C_{0.6})$ | 5 | 0.43 |
| 10 | Ti | 600 | $(Al_{0.4}Ti_{0.25}V_{0.35})N$ | 10 | 0.58 |
| 11 | Ta | 800 | $(Al_{0.4}Ti_{0.25}V_{0.35})N$ | 10 | 0.62 |
| 12 | Cr | 2 | $(Al_{0.4}Ti_{0.25}V_{0.35})N$ | 2 | 0.78 |
| 13 | W | 1 | $(Al_{0.4}Ti_{0.4}V_{0.2})(N_{0.6}C_{0.4})$ | 10 | 0.75 |
| 14 | Hf | 10 | $(Al_{0.4}Ti_{0.25}V_{0.35})N$ | 25 | 0.60 |
| 15 | Mo | 150 | $(Al_{0.4}Ti_{0.25}V_{0.35})N$ | 0.5 | 0.87 |
| 16 | None | — | $(Al_{0.6}Ti_{0.4})(N_{0.8}C_{0.2})$ | 5 | 0.57 |
| 17 | None | — | $(Al_{0.4}Ti_{0.25}V_{0.35})N$ | 3 | 0.79 |
| 18 | TiN | 1000 | $(Al_{0.4}Ti_{0.28}V_{0.35})N$ | 8 | 0.59 |

TABLE 41

| | First layer | | Second layer | | |
|---|---|---|---|---|---|
| No | Composition | T.L. (nm) | Composition | T.L. (μm) | Flank wear (mm) |
| 1 | $Al_{0.4}Ti_{0.25}V_{0.35}$ | 5 | $(Al_{0.4}Ti_{0.25}V_{0.35})N$ | 5 | 0.05 |
| 2 | $Al_{0.4}Ti_{0.4}V_{0.2}$ | 50 | $(Al_{0.4}Ti_{0.25}V_{0.35})N$ | 10 | 0.08 |
| 3 | $Al_{0.4}Ti_{0.25}V_{0.35}$ | 150 | $(Al_{0.4}Ti_{0.4}V_{0.2})(N_{0.6}C_{0.4})$ | 20 | 0.09 |
| 4 | $Al_{0.3}Ti_{0.6}V_{0.1}$ | 500 | $(Al_{0.6}Ti_{0.2}V_{0.2})N$ | 15 | 0.11 |
| 5 | $Al_{0.2}Ti_{0.3}V_{0.5}$ | 200 | $(Al_{0.3}Ti_{0.6}V_{0.1})N$ | 1 | 0.14 |
| 6 | $Al_{0.6}Ti_{0.2}V_{0.2}$ | 15 | $(Al_{0.2}Ti_{0.3}V_{0.5})N$ | 8 | 0.18 |
| 7 | $Al_{0.4}Ti_{0.25}V_{0.35}$ | 100 | $(Al_{0.5}Ti_{0.15}V_{0.35})N$ | 5 | 0.45 |
| 8 | $Al_{0.4}Ti_{0.4}V_{0.2}$ | 500 | $(Al_{0.8}Ti_{0.15}V_{0.05})N$ | 12 | 0.50 |
| 9 | $Al_{0.4}Ti_{0.4}V_{0.2}$ | 50 | $(Al_{0.15}Ti_{0.8}V_{0.05})N$ | 20 | 0.39 |
| 10 | $Al_{0.8}Ti_{0.15}V_{0.05}$ | 200 | $(Al_{0.4}Ti_{0.25}V_{0.35})N$ | 5 | 0.42 |
| 11 | $Al_{0.4}Ti_{0.25}V_{0.35}$ | 100 | $(Al_{0.4}Ti_{0.4}V_{0.2})(N_{0.4}C_{0.6})$ | 5 | 0.44 |
| 12 | $Al_{0.4}Ti_{0.4}V_{0.2}$ | 600 | $(Al_{0.4}Ti_{0.25}V_{0.35})N$ | 10 | 0.59 |
| 13 | $Al_{0.4}Ti_{0.4}V_{0.2}$ | 800 | $(Al_{0.4}Ti_{0.25}V_{0.35})N$ | 10 | 0.61 |
| 14 | $Al_{0.4}Ti_{0.4}V_{0.2}$ | 2 | $(Al_{0.4}Ti_{0.25}V_{0.35})N$ | 2 | 0.79 |
| 15 | $Al_{0.4}Ti_{0.4}V_{0.2}$ | 1 | $(Al_{0.4}Ti_{0.4}V_{0.2})(N_{0.6}C_{0.4})$ | 10 | 0.76 |
| 16 | $Al_{0.4}Ti_{0.4}V_{0.2}$ | 10 | $(Al_{0.4}Ti_{0.25}V_{0.35})N$ | 25 | 0.69 |
| 17 | $Al_{0.4}Ti_{0.4}V_{0.2}$ | 150 | $(Al_{0.4}Ti_{0.25}V_{0.35})N$ | 0.5 | 0.88 |
| 18 | None | — | $(Al_{0.6}Ti_{0.4})(N_{0.8}C_{0.2})$ | 5 | 0.57 |
| 19 | None | — | $(Al_{0.4}Ti_{0.25}V_{0.35})N$ | 3 | 0.79 |
| 20 | TiN | 1000 | $(Al_{0.4}Ti_{0.25}V_{0.35})N$ | 8 | 0.59 |

What is claimed is:

1. A member coated with a hard coating and having wear resistance, the hard coating comprising an adhesion reinforcing layer formed on a surface of the member and a second layer, wherein the adhesion layer has a composition selected from the group consisting of a) $(Al_aTi_b)(N_cC_d)$, where $0.25 \leq a \leq 0.75$, $a+b=1$, $0.6 \leq c \leq 1$, and $c+d=1$;

b) one or more metals from the groups 4A, 5A and 6A of the Periodic Table as an essential component; and c) $Al_xTi_yV_z$, where $0 \leq x \leq 0.75$, $0<y<1$, $0<z<1$, and $x+y+z=1$;

and a second layer is formed on the adhesion layer which has a composition represented by the formula:

$$(Al_p, Ti_q, V_r)(N_u, C_v),$$

where $0 \leq p \leq 0.75$, $0.20 \leq q \leq 0.75$, $0.10 \leq r \leq 0.75$, $p+q+r=1$, $0.6 \leq u \leq 1$, and $u+v=1$.

2. The hard coating coated member according to claim 1, wherein the second layer has a composition represented by the following formula:

$$(Ti_qV_r)(N_uC_v)$$

where $0.25 \leq q \leq 0.75$, $q+r=1$, $0.6 \leq u \leq 1$, and $u+v=1$.

3. The hard coating coated member according to claim 2, wherein the adhesion reinforcing layer consists essentially of any metal in the group 4A, 5A, and 6A metals.

4. The hard coating coated member according to claim 3, wherein the thickness of the adhesion reinforcing layer is to 5 to 500 nm.

5. The hard coating coated member according to claim 2, wherein the adhesion reinforcing layer has a composition represented by the following formula:

$$(Al_aTi_b)(N_cC_d)$$

where $0.25 \leq a \leq 0.75$, $a+b=1$, $0.6 \leq c \leq 1$, and $c+d=1$.

6. The hard coating coated member according to claim 5, having an intermediate layer between the adhesion reinforcing layer and the second layer, the intermediate layer consisting essentially of any metal in the group 4A, 5A, and 6A metals and having a thickness of 500 nm or smaller.

7. The hard coating coated member according to claim 6, wherein the thickness of the entire coating is 0.8 to 50 μm.

8. The hard coating coated member according to claim 5, having an intermediate layer between the adhesion reinforcing layer and the second layer, the intermediate layer having a thickness of 500 nm or smaller and having a composition represented by the following formula:

$$Al_xTi_yV_z$$

where $0 \leq x \leq 0.75$, $0<y<1$, $0<z<1$, and $x+y+z=1$.

9. The hard coating coated member according to claim 8, wherein the thickness of the entire coating is 0.8 to 50 μm.

10. The hard coating member according to claim 5, wherein a is 0.40 to 0.70.

11. The hard coating member according to claim 10, wherein a is 0.56 to 0.65.

12. The hard coating coated member according to claim 2, wherein the adhesion reinforcing layer has a composition represented by the following formula:

$$Al_xTi_yV_z$$

where $0 \leq x \leq 0.75$, $0 < y < 1$, $0 < z < 1$, and $x+y+z=1$.

13. The hard coating coated member according to claim 12, wherein the thickness of the adhesion reinforcing layer is 5 to 500 nm.

14. The hard coating member according to claim 12, wherein x is 0.25 to 0.75.

15. The hard coating member according to claim 14, wherein x is 0.30 to 0.70.

16. The hard coating coated member according to claim 1, wherein the second layer has a composition represented by the following formula:

$$(Al_pTi_qV_r)(N_uC_v)$$

where $0.20 \leq p \leq 0.75$, $0.20 \leq q \leq 0.75$, $0.1 \leq r \leq 0.5$, $p+q+r=1$, $0.6 \leq u \leq 1$, and $u+v=1$.

17. The hard coating coated member according to claim 16, wherein the adhesion reinforcing layer has a composition represented by the following formula:

$$(Al_aTi_b)(N_cC_d)$$

where $0.25 \leq a \leq 0.75$, $a+b=1$, $0.6 \leq c \leq 1$, and $c+d=1$.

18. The hard-coating coated member according to claim 17, having an intermediate layer between the adhesion reinforcing layer and the second layer, the intermediate layer consisting essentially of any metal in the group 4A, 5A, and 6A metals and having a thickness of 500 nm or smaller.

19. The hard coating coated member according to claim 18, wherein the thickness of the entire coating is 0.8 to 50 μm.

20. The hard coating coated member according to claim 17, having an intermediate layer between the adhesion reinforcing layer and the second layer, the intermediate layer having a thickness of 500 nm or smaller and having a composition represented by the following formula:

$$Al_xTi_yV_z$$

where $0 \leq x \leq 0.75$, $0 < y < 1$, $0 < z < 1$, and $x+y+z=1$.

21. The hard coating coated member according to claim 20, wherein the thickness of the entire coating is 0.8 to 50 μm.

22. The hard coating member according to claim 17, wherein a is 0.40 to 0.70.

23. The hard coating member according to claim 22, wherein a is 0.56 to 0.65.

24. The hard coating coated member according to claim 16 wherein the adhesion reinforcing layer consists essentially of any metal in the group 4A, 5A, and 6A metals.

25. The hard coating coated member according to claim 24, wherein the thickness of the adhesion reinforcing layer is 5 to 500 nm.

26. The hard coating coated member according to claim 16, wherein the adhesion reinforcing layer has a composition represented by the following formula:

$$Al_xTi_yV_z$$

where $0 \leq x \leq 0.75$, $0 < y < 1$, $0 < z < 1$, and $x+y+z=1$.

27. The hard coating coated member according to claim 26, wherein the thickness of the adhesion reinforcing layer is 5 to 500 nm.

28. The hard coating member according to claim 26, wherein x is 0.25 to 0.75.

29. The hard coating member according to claim 28, wherein x is 0.30 to 0.70.

30. The hard coating coated member according to claim 16, wherein the adhesion reinforcing layer has a composition represented by the following formula:

$$Al_xTi_yV_z$$

where $0.20 \leq x \leq 0.75$, $0.20 \leq y \leq 0.75$, $0.1 \leq z \leq 0.5$, and $x+y+z=1$.

31. The hard coating coated member according to claim 24, wherein the total thickness of the adhesion reinforcing layer and the second layer is 0.8 to 20 μm.

32. The hard coating member according to claim 1, wherein p/q is 1.0 to 1.6.

33. The hard coating member according to claim 1, having a critical load (N) of at least 58.2.

34. The hard coating member according to claim 33, having a critical load (N) of 58.2 to 87.5.

35. The hard coating member according to claim 1, having a hardness of at least 3093.

36. The hard coating member according to claim 35, having a hardness of 3093 to 3420.

37. The hard coating member according to claim 1, having a wear of less than 0.37 mm.

38. The hard coating member according to claim 37, having a wear loss of less than 0.25 mm.

39. The hard coating member according to claim 1, wherein said adhesion reinforcing layer has an adhesion of at least 60 N in the scratch test defined in appendix #2 of JIS H8690.

* * * * *